(12) United States Patent
Qiu et al.

(10) Patent No.: US 6,402,304 B1
(45) Date of Patent: Jun. 11, 2002

(54) PIEZOELECTRIC ACTUATOR, INK JET PRINTING HEAD, PRINTER, METHOD FOR MANUFACTURING PIEZOELECTRIC ACTUATOR, AND METHOD FOR MANUFACTURING INK JET PRINTING HEAD

(75) Inventors: Hong Qiu; Koji Sumi; Masato Shimada; Tsutomu Nishiwaki, all of Nagano; Masanori Okuyama; Zhi Quiang Wei, both of Osaka, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/372,990

(22) Filed: Aug. 12, 1999

(30) Foreign Application Priority Data

Aug. 12, 1998 (JP) ............................. 10-228203
Aug. 12, 1998 (JP) ............................. 10-228204

(51) Int. Cl.$^7$ ............................................. B41J 2/045
(52) U.S. Cl. ..................................................... 347/68
(58) Field of Search ........................... 347/68, 54, 20

(56) References Cited

U.S. PATENT DOCUMENTS 5,376,857 A * 12/1994 Takeuchi et al. ............. 310/328
5,719,607 A *  2/1998 Hasegawa et al. ............ 347/70
5,802,686 A *  9/1998 Shimada et al. ............ 29/25.35
6,147,438 A * 11/2000 Nishiwaki et al. .......... 310/363
6,203,608 B1 *  3/2001 Sun et al. ................. 106/287.19

OTHER PUBLICATIONS

Xu, W–Ping, et al., "Application of Hydrothermal Mechanism for Tailor–Making Perovskite Titanate Films", IEEE Proc. of the $9^{th}$ Int'l., Symp. on Electrets, Shanghai, China, Sep. 25–30, pp. 617–622 (1996).

* cited by examiner

Primary Examiner—N. Le
Assistant Examiner—K. Feggins
(74) Attorney, Agent, or Firm—Sterne, Kessler, Goldstein & Fox, P.L.L.C.

(57) ABSTRACT

A piezoelectric actuator, made of a substrate and a piezoelectric film layer resistant to erosion is provided. The area of the piezoelectric actuator can be enlarged, and has a flat top surface. The present invention further provides an ink jet printing head, a printer, a method for manufacturing a piezoelectric actuator, and a method for manufacturing an ink jet printing head. The piezoelectric actuator includes a piezoelectric film disposed between a lower electrode and an upper electrode. Columnar crystal grains of piezoelectric ceramic which compose the piezoelectric actuator are random-oriented in a film thickness direction, and have a mean diameter in the range of 100 nm to 15,000 nm. The method for manufacturing the actuator includes the step of forming precursor films, which are composed of metal and oxygen, over a lower electrode, providing a hydrothermal treatment by dipping the precursor films in an alkaline solution, which as 2 M[mol/l] or less, more preferably 0.1 M[mol/l] or less, concentration of a given alkaline solute, and promoting the crystallization under certain conditions.

23 Claims, 14 Drawing Sheets

PIEZOELECTRIC ACTUATOR, INK JET PRINTING HEAD, PRINTER, METHOD FOR MANUFACTURING PIEZOELECTRIC ACTUATOR, AND METHOD FOR MANUFACTURING INK JET PRINTING HEAD

BACKGROUND OF THE INVENTION

1. Field of the Invention

The present invention relates to a piezoelectric actuator used for, for example, an ink jet printing head. More particularly, this invention relates to a method for manufacturing a piezoelectric actuator, concerning which the internal stress is extremely relaxed, and which permits upsizing of a head, and also relates to a product made by such a manufacturing method.

2. Description of the Related Art

A piezoelectric actuator is a device having an electromechanical transducing function and is composed of crystallized piezoelectric ceramic. As a method for manufacturing this piezoelectric actuator, generally employed is a so-called sol-gel method of applying a sol of organometallic compound over an electrode, drying and pyrolysing the sol, and giving high temperature treatment to cause crystallization, which is followed by a method of causing instant crystallization with high heat.

By another crystallization method which is called a "hydrothermal method," a Ti or Ni substrate is dipped in a KOH solution containing organometallic compound, thereby causing PZT grains to deposit.

However, when the piezoelectric actuator is manufactured by the sol-gel method, there is a problem in that thermal stress occurs and cracks are easily made in a piezoelectric film. Accordingly, it has been difficult to manufacture a piezoelectric actuator with a large area. For example, it has been impossible to manufacture a piezoelectric actuator for a line printer.

Moreover, a piezoelectric actuator manufactured by the conventional hydrothermal method has a rough surface and, therefore, it has been difficult to make an upper electrode in good contact with the piezoelectric actuator.

The research paper on "Application of Hydrothermal Mechanism for Tailor-making Perovskite Titanate Films," IEEE Proc. of the 9$^{th}$ International Symposium on Electrets, Shanghai, China (held on September 25 through September 30) (pp. 617–622) (1996), which was prepared by W-ping Xu, Masanori Okuyama, et al., describes a method of causing a precursor film of piezoelectric ceramic to crystallize by putting the precursor film, which has been applied over a substrate and has been dried, in a given alkaline solution. This method of causing crystallization in an alkaline solution is called the hydrothermal method. This hydrothermal method enables the crystallization at comparatively lower temperatures than in the case of the sol-gel method, thereby giving rise to several advantages. For example, since the low temperature manufacturing results in less internal stress, including thermal stress, generated in the film in the course of crystallization, it is considered to be possible to form a piezoelectric film with a larger area than a conventional piezoelectric film.

The above-mentioned research paper states that an alkaline treatment solution is used for the hydrothermal treatment.

However, there is a problem in that silicon, which is suitable for fine processing as a material for a pressure chamber substrate, or the piezoelectric film layer itself is easily soluble in a strong alkaline treatment solution such as KOH. Therefore, when silicon is used for the substrate, it is necessary to use a weak alkaline solution prepared by adding Ba, such as barium hydroxide, to the strong alkaline solution, or to adjust treatment conditions. Particularly, when it is necessary to apply fine processing to a substrate for which silicon is used, even the use of the weak alkaline treatment solution containing Ba may cause slight erosion and, therefore, it is considered to cause inconvenience. It is desirable that the alkaline degree of the treatment solution be as low as possible.

Moreover, the above-mentioned research paper does not include sufficient descriptions about the manufacture of a piezoelectric actuator with good characteristics, which is suitable for an ink jet printing head for a printer.

SUMMARY OF THE INVENTION

In consideration of the above-described inconveniences and as a result of numerous experiments, the inventors of this application have found the hydrothermal treatment which causes little erosion.

Moreover, the inventors carried out experiments on the manufacture of piezoelectric actuators by the hydrothermal method, specifically on the conditions for manufacturing the entire piezoelectric actuators, including the application of a sol composed of organometallic compound, and then have found the manufacturing method appropriate for the practice of the above-mentioned hydrothermal method.

Namely, it is an object of this invention to provide a piezoelectric actuator which can be made with a large area and which has a crystal structure with flat surfaces.

It is another object of this invention to provide an ink jet printing head which is suitable for a line printer and which comprises a piezoelectric actuator that can be made with a large area and with a flat surface.

It is a still another object to provide a printer which comprises an ink jet printing head suitable for a line printer.

It is a further object to provide a method for manufacturing a piezoelectric actuator concerning which there is a wide selection of possible materials and options for manufacture conditions, and which has good performance.

It is a still further object to apply the above-mentioned method for manufacturing the piezoelectric actuator and to provide a method for manufacturing an ink jet printing head concerning which there is a wide selection of possible materials and options for manufacture conditions, and which has good performance.

Specifically speaking, this invention provides a piezoelectric actuator which comprises: a lower electrode; an upper electrode; and a piezoelectric film held between the lower electrode and the upper electrode, wherein the piezoelectric film is made of piezoelectric ceramic, and columnar crystal grains of the piezoelectric ceramic are random-oriented in a film thickness direction and a mean diameter of the columnar crystal grains is in the range of 100 nm to 15000 nm.

It is desirable that a mean diameter of the columnar crystal grains be in the range of 100 nm to 10000 nm.

The surface roughness of the upper electrode side of the piezoelectric film can be set at 20 nm or less as a maximum height.

The element composition of the piezoelectric film can include any one of the following piezoelectric ceramic materials among lead zirconate titanate $(Pb(Zr,Ti)O_3:PZT)$, lead lanthanum titanate $((Pb,La)TiO_3)$, lead lanthanum zirconate ((Pb,La)ZrO$_3$), lead lanthanum zirconate titanate ((Pb,La)(Zr,Ti)O$_3$:PLZT), and lead magnesium niobate zirconate titanate (Pb(Mg,Nb)(Zr,Ti)O$_3$:PMN-PZT).

Moreover, this invention provides an ink jet printing head with a piezoelectric actuator according to this invention, and such an ink jet printing head comprises: a pressure chamber substrate with a pressure chamber formed therein; a diaphragm provided on one side of the pressure chamber; and the piezoelectric actuator provided on the diaphragm at the position corresponding to the pressure chamber, wherein the piezoelectric actuator is composed to be capable of causing volume changes of the pressure chamber.

This invention also provides a printer with the above-described ink jet printing head according to this invention, and such a printer comprises: a recording medium carrying mechanism composed to be capable of supplying and taking out the recording media; and a head control circuit for causing the ink jet printing head to print at any position on the recording medium supplied by the recording medium carrying mechanism.

This invention further provides a printer with the above-described ink jet printing head according to this invention, and such a printer comprises: a recording medium carrying mechanism composed to be capable of supplying and taking out the recording media; and a head carrying mechanism for carrying the ink jet printing head to any position on the recording medium supplied by the recording medium carrying mechanism.

Furthermore, this invention provides a method for manufacturing a piezoelectric actuator comprising a piezoelectric film held between a lower electrode and an upper electrode, wherein the method comprises the steps of: forming a precursor film in an amorphous state, containing metal and oxygen, over the lower electrode; and giving hydrothermal treatment to the precursor film by dipping the precursor film in a given alkaline solution and promoting the crystallization under certain conditions.

As the above-described alkaline solution, a solution adjusted to contain an alkaline solute of concentration not higher than 2 M[mol/l] can be used. Preferably, a solution adjusted to contain the alkaline solute of concentration not higher than 0.5 M[mol/l] should be used. More preferably, a solution adjusted to contain the alkaline solute of concentration not higher than 0.1 M[mol/l] should be used. Most preferably, a solution adjusted to contain the alkaline solute of concentration not higher than 0.05 M[mol/l] should be used.

In the step of forming the precursor film, the precursor film in the amorphous state can be formed by applying a sol containing organometallic compound over the lower electrode and by heating it.

Moreover, the step of forming the precursor film can comprise the steps of: applying a precursor composed of organometallic compound; drying the precursor at a given temperature; pyrolysing the precursor at temperatures ranging from 300° C. to 500° C.

The alkaline solution can be selected from the group consisting of KOH, Ba(OH)$_2$, Pb(OH)$_2$, Ba(OH)$_2$+Pb(OH)$_2$, KOH +Ba(OH)$_2$, and KOH+Pb(OH)$_2$.

In the pyrolysing step, the precursor can be degreased at a temperature of 450° C.

In the drying step, the precursor can be dried at temperatures ranging from 150° C. to 200° C.

In the step of forming the precursor, the precursor film in the amorphous state containing metal and oxygen can be formed by any one of the following methods among an RF sputtering method, an ion beam sputtering method, and an electron beam deposition method.

The certain conditions in the hydrothermal treatment step can be set at temperatures ranging from 100° C. to 200° C. and at 10 or lower atmospheric pressure.

The certain conditions in the hydrothermal treatment step can be set at a temperature of 140° C. and at 4 atmospheric pressure.

By the method for manufacturing a piezoelectric actuator according to this invention, the step of applying the precursor, the step of drying the precursor, and the step of pyrolysing the dried precursor can be repeated at least once.

In the step of forming the precursor, the step of applying the organometallic compound solution, the step of drying a film of organometallic compound, which is formed by the application, at a first temperature, and the step of pyrolysing the dried organometallic compound film at a second temperature can be repeated at least once.

Furthermore, this invention provides a method for manufacturing an ink jet printing head comprising a piezoelectric actuator manufactured by the above-described manufacturing method according to this invention, and such a method for manufacturing an ink jet printing head comprises the steps of: forming a diaphragm on one side of a substrate; manufacturing the piezoelectric actuator on the diaphragm; and forming a pressure chamber by etching the substrate in such arrangement that the diaphragm with the piezoelectric actuator provided thereon forms one side of the pressure chamber.

DETAILED DESCRIPTION OF THE PREFERRED EMBODIMENTS

Embodiments of this invention are hereinafter explained by referring to the attached drawings. These embodiments relate to a piezoelectric actuator utilizing a hydrothermal method, and to an ink jet printing head and a printer which use the piezoelectric actuator.

(Embodiment 1)

An explanation is first given about the structure of a printer on which an ink jet printing head having a piezoelectric actuator according to Embodiment 1 of this invention is used.

Figure 1:
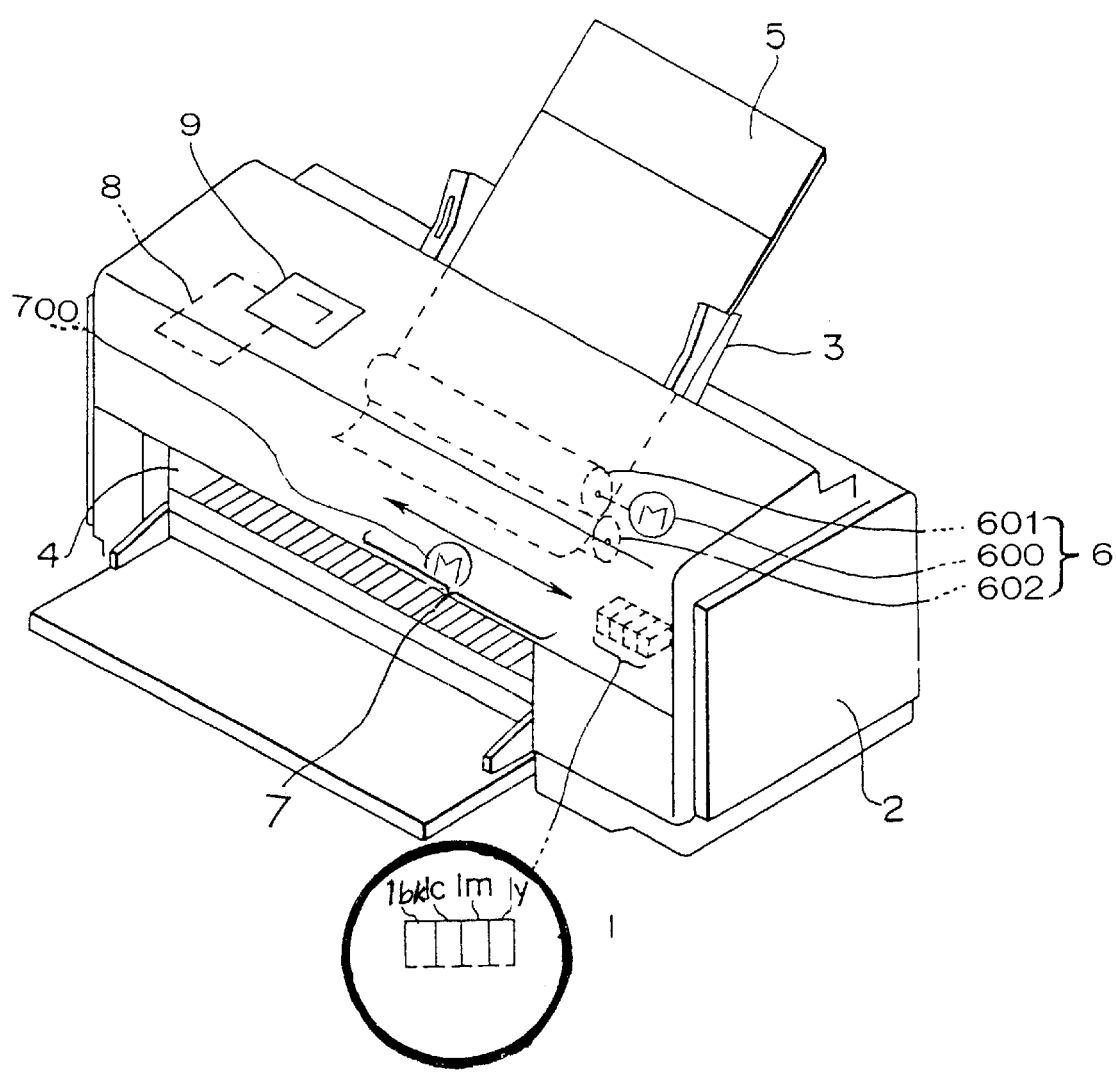
FIG. 1 is a perspective view of a printer according, to Embodiment 1 of this invention, which illustrates the structure of the printer.

As shown in FIG. 1, a printer of Embodiment 1 has a tray 3, an outlet 4, and an operation button 9, which are provided on a main body 2. Inside the main body 2 are provided an ink jet printing head 1, a feeding mechanism 6, a head controlling mechanism 7, and a control circuit 8.

The ink jet printing head 1 comprises a piezoelectric actuator manufactured by a manufacturing method of this invention. As shown as an enlarged view in a circle, the ink jet printing head 1 comprises heads 1bk, 1c, 1m and 1y, each of which has the same structure.

Each head is constructed to be capable of discharging ink from its nozzle in response to a discharge signal supplied from the control circuit 8. The head 1bk discharges black ink, the head 1c discharges cyan ink, the head 1m discharges magenta ink, and the head 1y discharges yellow ink. However, if no color printing is required, the ink jet printing head may be composed of, for example, only black ink. Specific structure of the head will be described later.

The main body 2 is a housing for the head 1 and has the feeding mechanism 6 located at a position which makes it possible to feed paper 5 from the tray 3, and also has the ink jet printing head 1 located at a position which makes it possible to pass over and across the paper 5. The tray 3 is composed to be capable of feeding the paper 5 before print to the feeding mechanism 6, and the outlet 4 is an outlet for outputting the paper 5 which has been printed.

The feeding mechanism 6 comprises a motor 600, rollers 601 and 602, and a mechanical structure not shown in the drawing. The motor 600 is rotatable in response to a drive signal supplied from the control circuit 8. The mechanical structure is composed to be capable of transmitting the torque of the motor 600 to the rollers 601 and 602. The rollers 601 and 602 are designed to rotate as the torque of the motor 600 is transmitted to them. The rotation of the rollers draw in the paper 5 placed on the tray 3 and the paper 5 is then fed so that printing can be performed by the head 1.

The head controlling mechanism 7 comprises a motor 700 and a mechanical structure not shown in the drawing. The motor 700 is designed to be rotatable in response to a head moving signal supplied from the control circuit 8. The mechanical structure converts the rotational motion of the motor 7 into horizontal movement, so that the ink jet printing head 1 can be moved in directions indicated by the arrows in FIG. 1. However, if the ink jet printing head 1 is formed with such a large area that it can cover the widthwise direction of the paper (for example, in the case of a line printer), it is unnecessary to move the head itself. In other words, the head moving mechanism is not an essential component.

Although it is not shown in the drawing, the control circuit 8 comprises a CPU, a ROM, a RAM, an interface circuit, and the like. The control circuit 8 supplies the drive signal to the feeding mechanism 6 in response to print information supplied from a computer through a connector not shown in the drawing, supplies the head moving signal to the head controlling mechanism 7, and supplies the discharge signal to the inkjet printing head 1. The control circuit 8 is also designed to be capable of setting and resetting operation modes in response to an operation signal sent from an operation panel 9.

Figure 2:
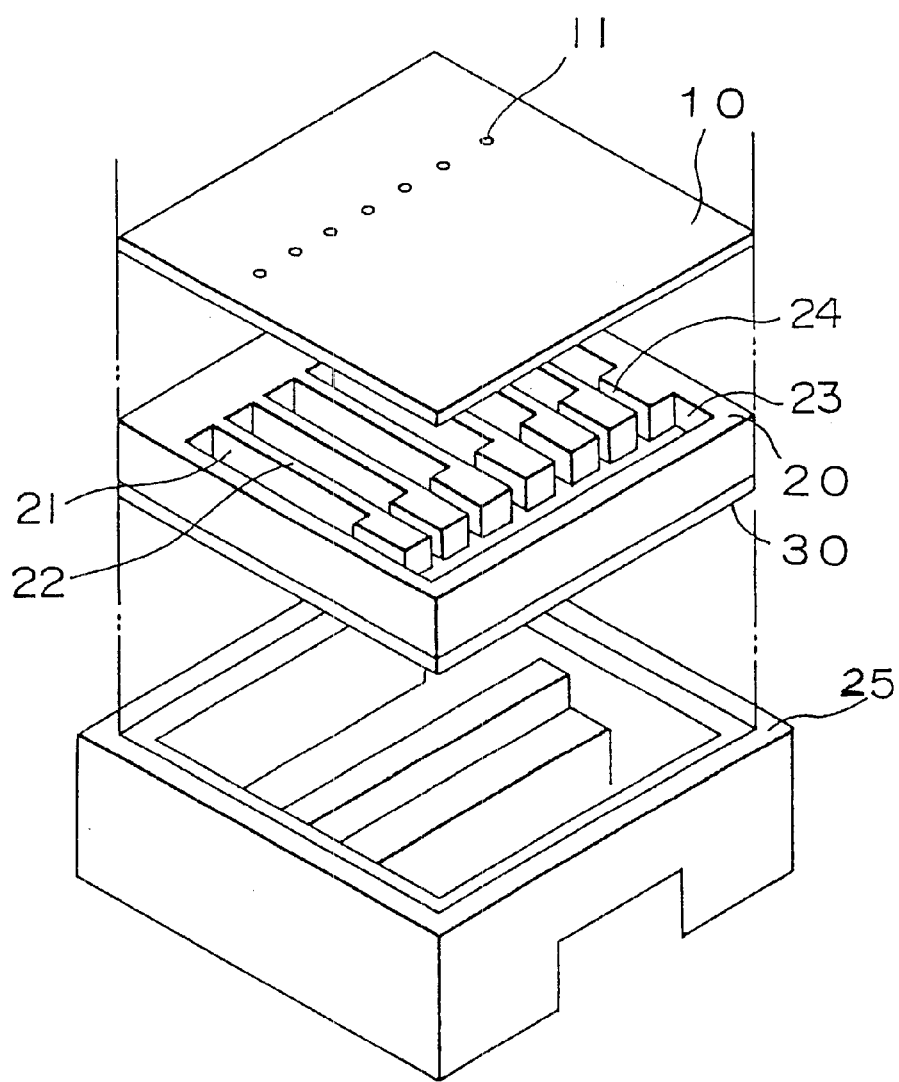
FIG. 2 is an exploded perspective view of an ink jet printing head according to Embodiment 1 of this invention.
Figure 3:
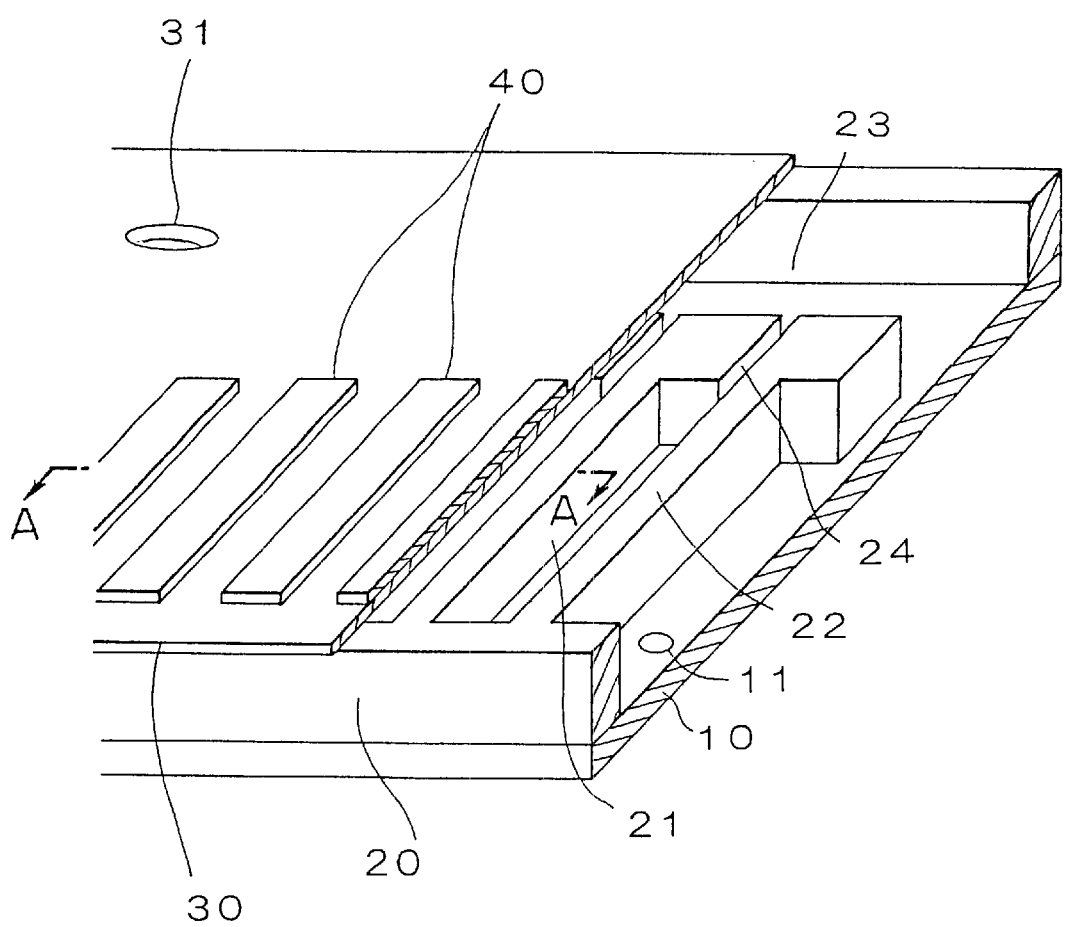
FIG. 3 is a partly sectional perspective view of the ink jet printing head according to Embodiment 1 of this invention.

An explanation is hereinafter given about the structure of the ink jet printing head of this invention. As shown in FIGS. 2 and 3, the ink jet printing head 1 comprises a nozzle plate 10, a pressure chamber substrate 20, a diaphragm 30, and a housing 25. The pressure chamber substrate 20 comprises cavities 21, side walls (partitions) 22, a reservoir 23, and supply ports 24. The cavity is a pressure chamber which is formed by etching the substrate made of silicon or the like and which serves as a space for storing ink or the like to be discharged. The side walls 22 are formed so as to partition the cavities 21. The reservoir 23 is a common channel for filling the respective cavities 21 with ink. The supply ports 24 are formed to be capable of introducing ink from the reservoir 23 to the respective cavities 21.

The nozzle plate 10 is pasted to one side of the pressure chamber substrate 20 in a manner such that nozzle holes 11 be located at positions corresponding to the respective cavities 21 provided in the pressure chamber substrate 20. The pressure chamber substrate 20 on which the nozzle plate 10 is pasted is then placed in the housing 25 as shown in FIG. 2, thereby composing the ink jet printing head 1.

The diaphragm 30 is pasted to the other side of the pressure chamber substrate 20. The diaphragm 30 has the piezoelectric actuator 40 mounted thereon. In the diaphragm 30, there is an ink tank hole 31 capable of supplying ink stored in an ink tank (not shown) to the inside of the pressure chamber substrate 20.

Figure 4:
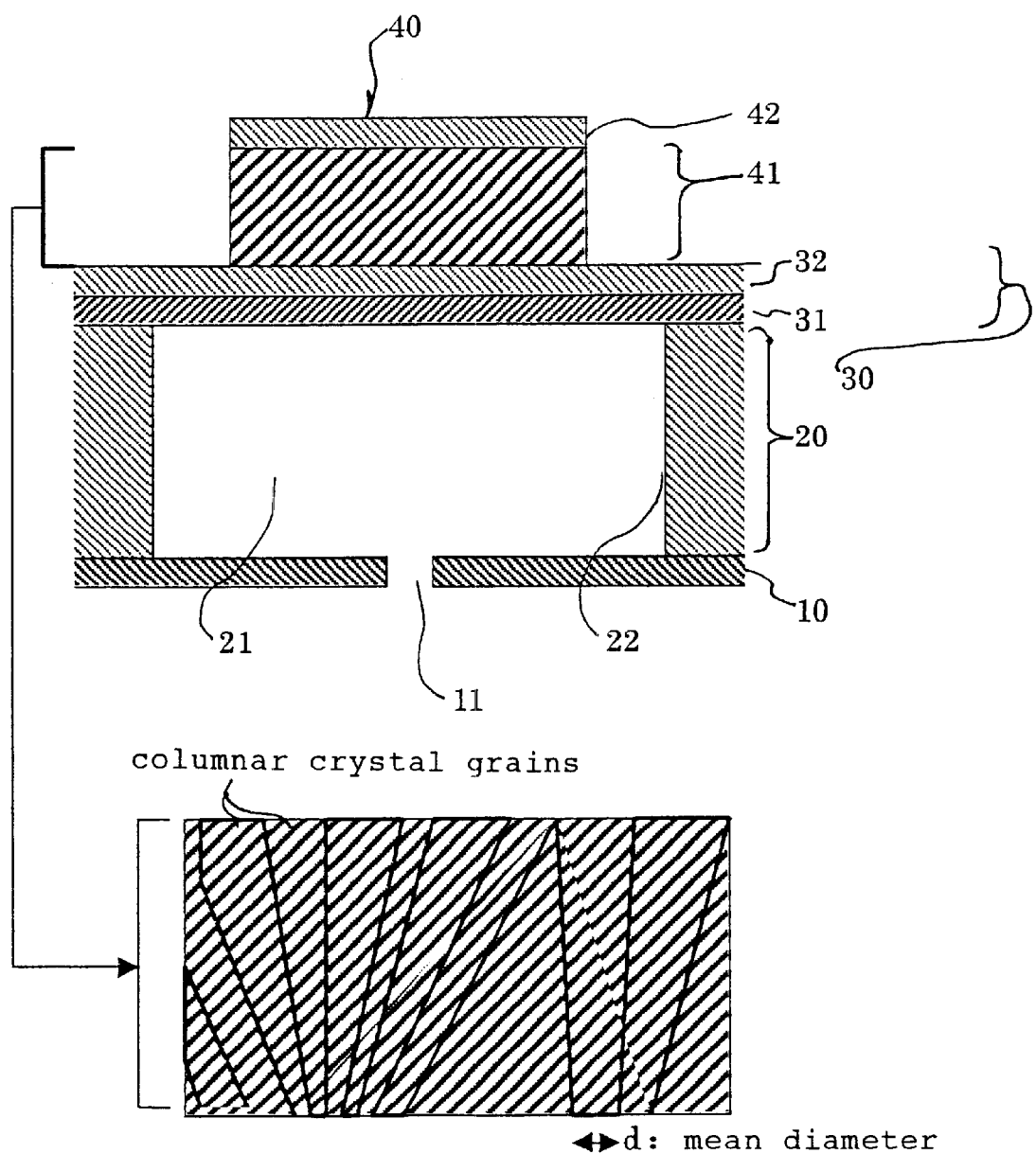
FIG. 4 is a sectional view of a piezoelectric actuator according to Embodiment 1 of this invention, which illustrates the layer structure of the piezoelectric actuator.

FIG. 4 is a sectional view illustrating more specific structures of the ink jet printing head and the piezoelectric actuator of this invention.

As shown in FIG. 4, the diaphragm 30 is composed by laminating an insulating film 31 and a lower electrode 32. The piezoelectric actuator 40 is composed by laminating a piezoelectric film layer 41 and an upper electrode 42.

The insulating film 31 is composed of a nonconductive material such as silicon dioxide prepared by, for example, thermally oxidizing a silicon substrate. The insulating film 31 deforms due to the deformation of the piezoelectric layer and is composed to be capable of momentarily increasing the internal pressure of the cavity 21.

The lower electrode 32 is one electrode for applying voltage on the piezoelectric layer and is composed of a conductive material such as titanium (Ti). The lower electrode 32 is formed in the same area as that of the insulating film 31 so that it functions as a common electrode for a plurality of piezoelectric actuators formed over the pressure chamber substrate 20. However, it is also possible to form the lower electrode 32 in the same size as that of the piezoelectric film layer 41, that is, in the same shape as that of the upper electrode.

The upper electrode 42 is the other electrode for applying voltage on the piezoelectric layer and is composed of a conductive material such as platinum (Pt) with a film thickness of 0.1 μm.

The piezoelectric film layer 41 composing the piezoelectric actuator 40 is crystals of piezoelectric ceramic which have a perovskite structure and which, are manufactured by the manufacturing method of this invention. The piezoelectric film layer 41 is formed in a given shape over the diaphragm 30. Specifically, as can be seen in the enlarged view shown in the lower part of FIG. 11 the piezoelectric film layer 41 of this invention is characterized in that its crystal grains in columnar shapes (columnar crystal grains) are random-oriented where crystal orientation is inconstant. Moreover, the piezoelectric film layer 41 is characterized in that the width of these columnar crystal grains in a direction parallel to the surface of the electrode film, that is, a mean diameter d of the columnar crystal grains is in the range of 100 nm to 15000 nm, more preferably, in the range of 100 nm to 10000 nm. The piezoelectric film layer 41 having the structure of such characteristics can be formed by applying the hydrothermal method of this invention.

The element composition of the piezoelectric film layer 41 includes, for example, any one of the following piezoelectric ceramic among lead zirconate titanate (Pb(Zr,Ti)$O_3$:PZT), lead lanthanum titanate ((Pb,La)$TiO_3$), lead lanthanum zirconate ((Pb,La)$ZrO_3$), lead lanthanum zirconate titanate ((Pb,La)(Zr,Ti)$O_3$:PLZT), and lead magnesium niobate zirconate titanate (Pb(Mg,Nb)(Zr,Ti)$O_3$:PMN-PZT).

An explanation is hereinafter given about the principle of ink drop discharge in the structure of the ink jet printing head.

When the discharge signal is not supplied from the control circuit 8 and no voltage is applied between the lower electrode 32 and the upper electrode 42 of the piezoelectric actuator 40, the piezoelectric film layer 41 will not deform. No pressure change will occur in the cavity 21 on which the piezoelectric actuator 40 without any discharge signal supplied thereto is provided, and no ink drops will be discharged from its nozzle hole 11.

On the other hand, if the discharge signal is supplied from the control circuit 8 and constant voltage is applied between the lower electrode 32 and the upper electrode 42 of the piezoelectric actuator 40, the piezoelectric film layer 41 deforms. In the cavity 21 on which the piezoelectric actuator 40 with the discharge signal supplied thereto is provided, the diaphragm 30 deflects considerably. Accordingly, the pressure within the cavity 21 increases momentarily, thereby discharging ink drops from the nozzle hole 11.

An explanation is hereinafter given about the method for manufacturing the piezoelectric actuator together with the method for manufacturing the ink jet printing head.

Sol Manufacture

A sol of piezoelectric ceramic is first manufactured, which is the material for the piezoelectric film layer. For example, titanium tetraisopropoxide, niobium pentaethoxide and zirconium tetra-n-propoxide are mixed in 2-n-butoxyethanol, and the mixture is then stirred for 20 minutes at room temperature. Subsequently, diethanolamine is added to the mixture, which is further stirred for 20 minutes at room temperature. Lead acetate and magnesium acetate are added to the mixture, which is then heated up to 80° C. The obtained mixture in the heated state is stirred for 20 minutes and is then left to cool itself until it reaches room temperature. The metal alkoxide solution manufactured in the above-described steps is to be used as the sol. However, the method for manufacturing the sol is not limited to the above-described method.

The sol manufactured by the above-described method is used to manufacture the piezoelectric actuator and the ink jet printing head.

FIG. 5 shows sectional views illustrating the steps of manufacturing the piezoelectric actuator.

Figure 5A:
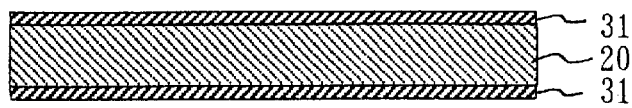
FIG. 5 shows sectional views of manufacturing steps, which illustrate a method for manufacturing the piezoelectric actuator according to Embodiment 1 of this invention.

Insulating Film Forming Step (FIG. 5(a))

The insulating film forming step is the step of forming the insulating film 31 on the silicon substrate 20. The silicon substrate 20 is formed, for example, with a thickness of about 200 μm and the insulating film 31 is formed with a thickness of about 1 μm. Known thermal oxidization or the like is employed for the manufacture of the insulating film.

Figure 5B:
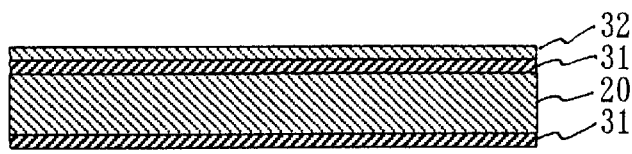

Lower Electrode Forming Step (FIG. 5(b))

The lower electrode forming step is the step for forming the lower electrode 32 over the insulating film 31. The lower electrode 32 is made by, for example, laminating a titanium layer with a thickness of 0.1 μm. Known DC sputtering or the like is employed for the manufacture of such a layer.

Figure 5C:
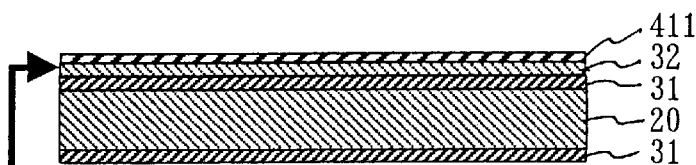

Step of Forming a Precursor Film for the Piezoelectric Film Layer (FIGS. 5(c)(d))

The step of forming a precursor film for the piezoelectric film layer is the step of repeating the application of a sol, and drying and pyrolysing of the applied sol, thereby forming a precursor film made of a plurality of thin films.

Firstly, the metal alkoxide solution which has been manufactured in the manner described above is applied in a uniform thickness over the lower electrode 32. If known spin coating is employed, for example, the application is performed for 30 seconds at 500 rpm, for 30 seconds at 1500 rpm, and lastly for 10 seconds at 500 rpm. At the applied stage, respective metal atoms composing PZT are dispersed as organometallic compound.

After the application, the sol is dried for a certain period of time at a constant temperature, for example, preferably in the range of 150° C. to 200° C., more preferably at about 180° C. The drying time is, for example, preferably from five minutes to 15 minutes, and more preferably about 10 minutes. Drying causes moisture to evaporate.

After the drying, pyrolysing is performed in an air at a constant temperature, for example, preferably in the range of 300° C. to 500° C., and more preferably at 450° C. for a certain period of time (60 minutes). The pyrolysing causes an organic substance, which forms coordinate or covalent bond with metal, to dissociate from the metal, and the organic substance initiates an oxidation combustion reaction and shatters in the atmosphere. The precursor film that is left after the pyrolysing is an amorphous film which consists of only the metal and oxygen. The above-described respective steps of application, drying and pyrolysing are repeated for a given number of times, for example, four times, thereby laminating four thin film layers (411, 412, etc). The multi-layered structure is intended to prevent the generation of cracks and to increase the film thickness.

The step of forming the precursor film for the piezoelectric film can be replaced with the step utilizing a sputtering method. For example, any one of the following methods among RF (Radio Frequency) sputtering, ion beam sputtering, electron beam deposition and the like is employed to manufacture the thin film layers 411, 412, etc. in the block, which form the precursor film. Then, as the sputtering is performed under certain conditions, for example, by using a sputter target including Pb, Zr, Ti, Mg, Nb and the like, with 500 W sputtering power, with 4Pa argon gas pressure during the sputtering, with no heating of the substrate during the sputtering, and the sputtering time being 80 minutes. As a result, the precursor film with a thickness of about 1000 nm can be obtained. Of course, the precursor film obtained by the sputtering contains no organic substance. Just like the precursor film formed by applying the above-described sol, and drying and pyrolysing the applied sol, this precursor film which is formed by the sputtering and which contains no organic substance is composed of only the metal and oxygen which are the direct elements for forming the piezoelectric film. Accordingly, it is possible to cause crystallization by means of phase changes made by the hydrothermal treatment as described later. If any organic substance remains in the precursor film, the organic substance may disturb crystallization. Consequently, the hydrothermal treatment which utilizes a low alkaline solution is performed on the condition that the precursor film contains no organic substance.

If it is required to crystallize a precursor film containing organic substances to make the piezoelectric film, it is necessary to give the hydrothermal treatment in an alkaline solution of not lower than a certain concentration. This is because the organic substance, which forms coordinate or covalent bond with metal, dissolves and departs because of alkali and the metal atom ionizes, and the ionized metal disperses and crystallizes because of the action of pressure and temperatures. In other words, pyrolysing with alkali is required.

Figure 5D:
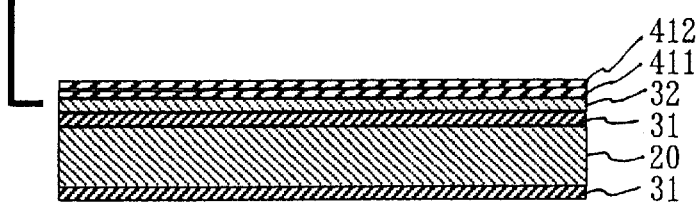
Figure 5E:
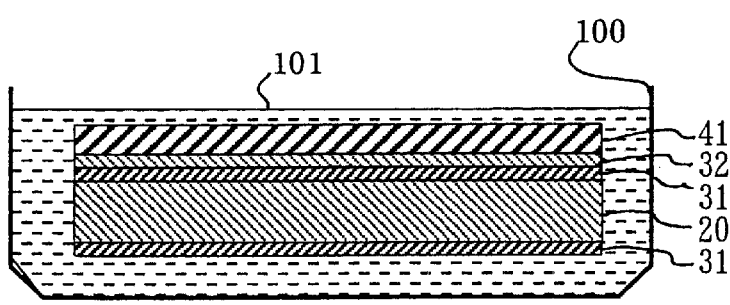

Hydrothermal Treatment Step (FIG. 5(e))

The hydrothermal treatment step is the step characteristic of this invention. A tank 100 is first filled with an alkalescent solution 101. Then, the precursor film 41 laminated in the above-described step together with the substrate is put in the tank 100 to promote the crystallization under certain conditions in an autoclave.

If an alkaline solution is used as the treatment solution, any one of the following among KOH, $Ba(OH)_2$, $Pb(OH)_2$, a mixed solution of $Ba(OH)_2$ and $Pb(OH)_2$, a mixed solution of $Ba(OH)_2$ and KOH, and a mixed solution of KOH and $Pb(OH)_2$ is used as a solute. This is because it is confirmed that the precursor film of piezoelectric ceramic crystallizes in these alkaline solutions.

As for the concentration of the alkaline solution, it is desirable in terms of the possibility of erosion of the substrate or the like that the concentration be adjusted to be lower than 0.1 M[mol/l]. In Embodiment 1, the concentration is adjusted to be 0.05 M[mol/l].

The temperature for the hydrothermal treatment is set in the range of 100° C. to 200° C. If the temperature is lower than the above-mentioned range, the crystallization will not be promoted. On the other hand, if the temperature is higher than the above-mentioned range, the precursor film or the piezoelectric film layer and the silicon substrate will be etched. The treatment temperature is set, for example, at about 140° C.

The pressure for the hydrothermal treatment is set in the range of 2 atmospheric pressure to 10 atmospheric pressure. This is because good crystals cannot be obtained if the pressure is out of the above-mentioned range. The pressure is set, for example, at about 4 atmospheric pressure. The time for the hydrothermal treatment is set in the range of 10 minutes to 60 minutes. If the time is shorter than the above-mentioned range, sufficient crystallization can be performed. On the other hand, if the time is longer than the above-mentioned range, there is a possibility that the piezoelectric film layer or the substrate may be eroded. The treatment time is set, for example, as about 30 minutes.

Figure 5F:
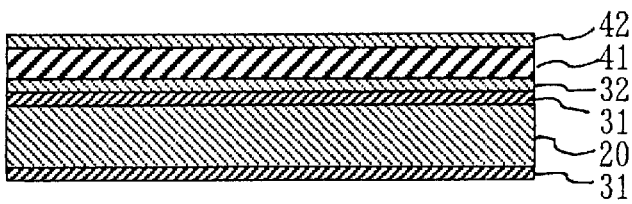

Upper Electrode Forming Step (FIG. 5(f))

The upper electrode 42 is formed over the piezoelectric film layer 41 by using technique of electron beam deposition, sputtering or the like. Platinum (Pt) or the like is used as a material for the upper electrode. The upper electrode is made with a thickness of about 100 nm.

The layered structure of the piezoelectric actuator is completed in the above-described step. It is only necessary to mold this layered structure by means of etching or the like in the shape that matches with a device to which the piezoelectric actuator is to be applied. In this embodiment, the treatment shown in the sectional views of manufacturing steps in FIG. 6 is further given because the piezoelectric actuator is used as a pressure generating source for an ink jet printing head.

Figure 6A:
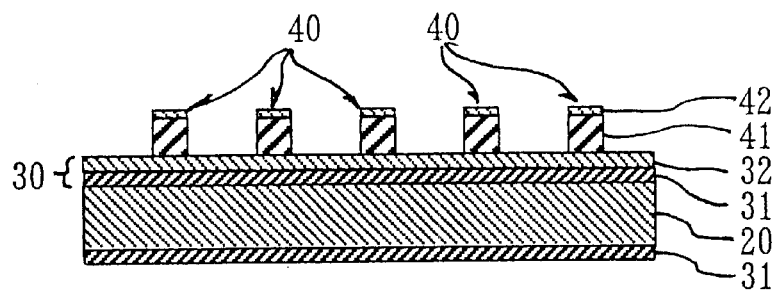
FIG. 6 shows sectional views of manufacturing steps which illustrate a method for manufacturing the ink jet printing head according to Embodiment 1 of this invention.

Etching Step (FIG. 6(a))

The etching step is the step of forming the piezoelectric actuator 40. Firstly, the laminated structures 41 and 42 of the piezoelectric actuator are masked in the shape corresponding to the cavities to be formed in the pressure chamber substrate 20. Etching is then performed around the mask, thereby forming the piezoelectric actuators 40. Specifically speaking, a resist material is first applied with a uniform thickness by any method such as spinner method or a spray method. Subsequently, the mask is formed in the shape of the piezoelectric actuators, and exposure and development is then performed, thereby forming a resist pattern over the upper electrode 42. The mask is formed in accordance with the type, whether positive or negative, of the resist material. Then, ion milling, dry etching or other method which is normally employed is applied to etch and remove the upper electrode 42 and the piezoelectric film layer 41. In the manner described above, the piezoelectric actuators 40 appropriate for the ink jet printing head can be formed.

Figure 6B:
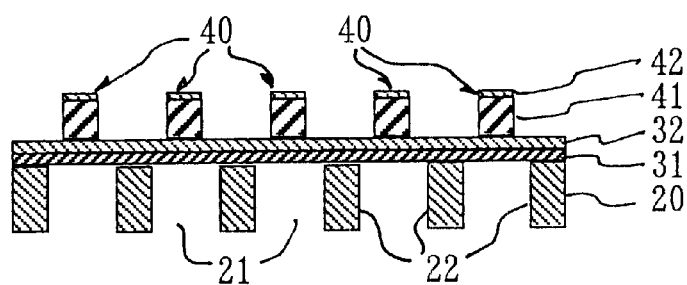

Pressure Chamber Forming Step (FIG. 6(b))

The pressure chamber forming step is the step of forming cavities 21 by etching the side of the pressure chamber substrate 20 as opposed to the side where the piezoelectric actuators 40 are formed. Etching of spaces for the cavities 21 is performed by employing anistropic etching which utilizes active gas, such as plane-parallel plate type reactive ion etching, from the side opposite to the side with the piezoelectric actuators 40 formed thereon. The portions which have remained without being etched become side walls 22.

Figure 6C:
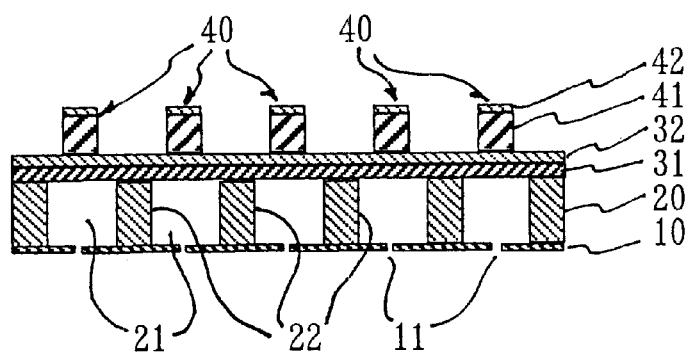

Nozzle Plate Pasting Step (FIG. 6(c))

The nozzle plate pasting step is the step of pasting a nozzle plate 10 on the etched silicon substrate 20 with an adhesive. At the time of pasting, the nozzle plate is aligned so that respective nozzle holes 11 will be located at the positions corresponding to the respective spaces of the cavities 21. Lastly, the pressure chamber substrate 20 with the nozzle plate 10 pasted thereon is attached to a housing 25 (as shown in FIG. 2), thereby completing the ink jet printing head 1.

If the nozzle plate and the pressure chamber substrate are etched and formed integrally, the nozzle plate pasting step is unnecessary. Namely, it is only necessary to etch the pressure chamber substrate in the shape of a combination of the nozzle plate and the pressure chamber substrate and to make nozzle holes lastly at the positions corresponding to the cavities.

Next, the ink jet printing head with lead zirconate titanate $(Pb(Zr_{0.56}Ti_{0.44})O_3)$ as the piezoelectric film layer is manufactured on the basis of the above-described manufacturing method.

Figure 7:
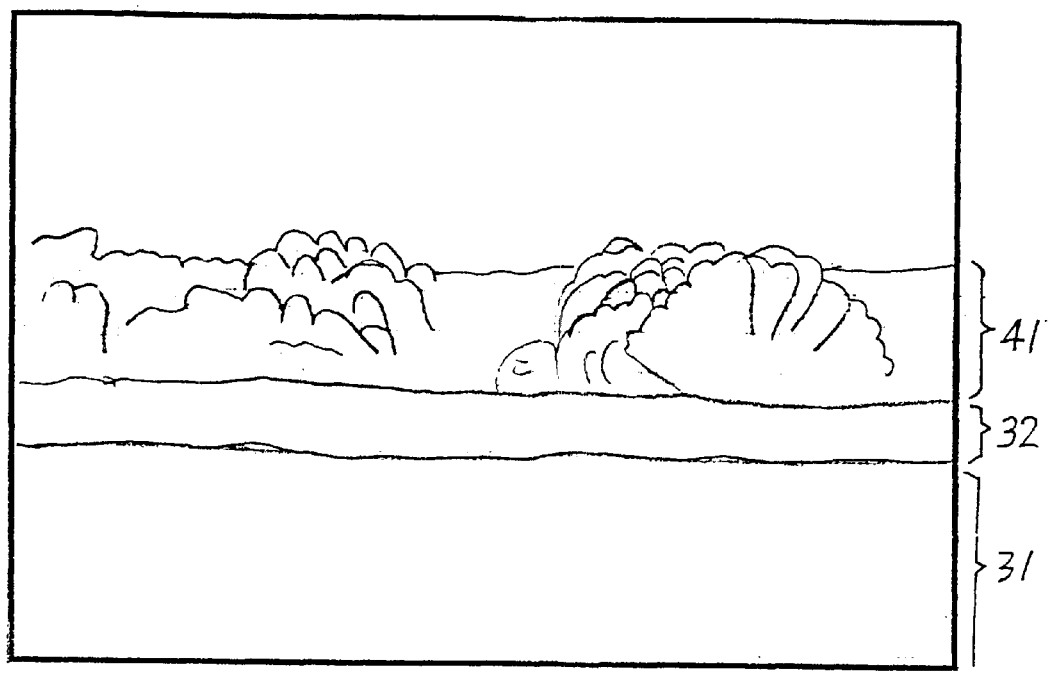
FIG. 7 is a traced drawing of a sectional SEM photograph of a piezoelectric film to which hydrothermal treatment has been given by the manufacturing method according to Embodiment 1 of this invention.

A sectional SEM (Scanning Electron Microscopy) photograph of this crystal after the hydrothermal treatment is taken. FIG. 7 is a traced drawing of this sectional SEM photograph.

PZT crystal grains in a cumulonimbus shape are formed over the lower electrode. Each of these crystal grains are columnar crystal grains, which gather to compose cumulonimbus-shaped crystals. Concerning the respective columnar crystal grains, some of them are crystals perpendicular to the lower electrode, some of them have an angle distribution from 0 to 90° with respective to the normal direction of lower electrode surface. The grain diameter of the individual columnar crystal grains ranges from 100 nm to 400 nm. As a result of measurement of these crystals by an X-ray pole figure, it is confirmed that the crystals are random-oriented in the film thickness direction. No erosion of the silicon substrate is confirmed.

According to Embodiment 1, since an alkaline solution of extremely low concentration is used as the treatment solution, the piezoelectric film or the substrate will never be etched by the treatment solution.

Moreover, since the alkali concentration is low, impurities such as alkali metal cations will not enter the inside of the piezoelectric actuators to deteriorate their characteristics.

Also, since crystallization can be performed at low temperatures, it is easy to give treatment for the crystallization.

Since high-temperature treatment is not performed, the elements of the lower electrode will never be dispersed in the piezoelectric film, thereby preventing the deterioration of the characteristics of the piezoelectric actuator.

Furthermore, since high-temperature treatment is not performed, neither changes in characteristics nor thermal stresses will be generated in the respective films, thereby enhancing the reliability of the piezoelectric actuator and the ink jet printing head.

Since the treatment solution is extremely low alkaline, it is unnecessary to select alkali-proof materials for the lower electrode or the substrate and, therefore, it is possible to expand the range of material selection.

Moreover, high-temperature treatment is not necessary and the rate of failure occurrence is low, thereby it is possible to reduce costs.

Furthermore, since no high-temperature treatment is performed and little thermal stress is generated, cracks will not be generated due to the thermal stress even if the piezoelectric actuator with a large area is manufactured. In other words, it is possible to provide an ink jet printing head suitable for a large area printing device such as a line printer.

This invention is not limited to the above-described embodiment, but various modifications can be made to adapt this invention. For example, PZT is used in the above embodiment, while piezoelectric ceramic for other actuators can be similarly crystallized by the hydrothermal method.

Moreover, the piezoelectric actuator manufactured according to this invention can be applied not only to a pressure generating source for the ink jet printing head, but also to actuator devices, including piezoelectric fans, ultrasonic motors, or ultrasonic transducers, and to the manufacture of such devices. Namely, the piezoelectric actuator of this invention can be made with a large area and realize cost reduction and, therefore, it is possible to provide new use which conventional products cannot afford, and to provide conventional functions at lower prices.

(Embodiment 2)

A printer of Embodiment 2 of this invention is hereinafter explained by referring to the attached drawings.

Concerning Embodiment 2, the same reference numerals are given to the members similar to those of Embodiment 1, and any detailed explanations thereof are omitted.

Figure 8:
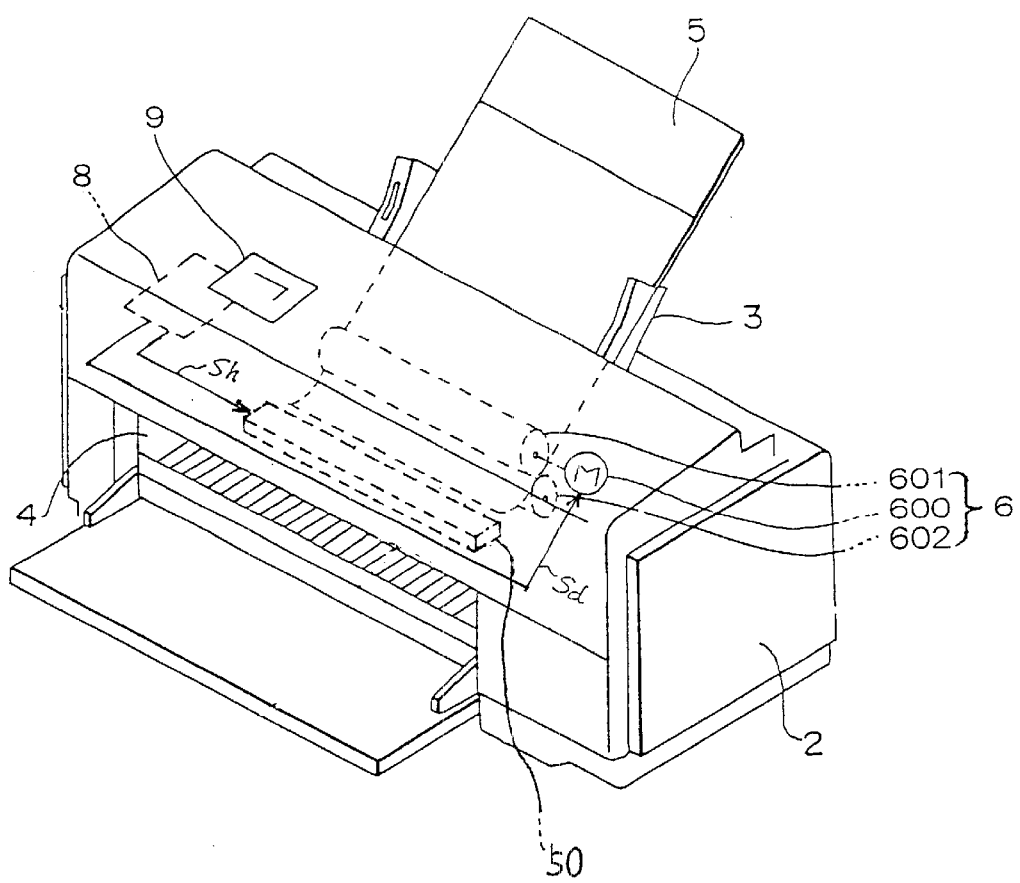
FIG. 8 is a perspective view of a printer according to Embodiment 2 of this invention, which illustrates the structure of the printer.

The printer of Embodiment 2 is capable of functioning as a line printer and, as shown in FIG. 8, its main body 2 has a tray 3, an outlet 4, and an operation button 9 provided thereon. Inside of the main body 2, an ink jet printing head 50, a feeding mechanism 6, and a control circuit 8 are provided.

The ink jet printing head 50 comprises a piezoelectric actuator manufactured by the manufacturing method of this invention. This head 50 is a head specifically used for a line printer and is formed with the length that covers the width of paper which can be fed. In other words, this head 50 is formed by the manufacturing method of this invention, in such size (length) as has been impossible by the prior art. The ink jet printing head 50 is composed to be capable of discharging ink from nozzles, which are made in the full width of paper, in response to a discharge signal Sh supplied from the control circuit 8.

The ink jet printing head 50 is constructed in a manner such that piezoelectric actuators 40, cavities 21 and nozzles 11 are continuously provided at a constant pitch so that the head 50 can cover the width of paper which is to be printed. The pitch between the nozzles can be changed at any time in accordance with printing accuracy. For example, the nozzles are located to realize 400 dpi.

The printer of Embodiment 2 has the structure similar to that of the printer described in Embodiment 1, except that the head 50 is a head designed for a line printer, and the actions of the printer also conform with those of the printer of Embodiment 1.

Any characters or graphics can be printed by supplying the discharge signal Sh to the individual piezoelectric actuator located at a position in the long head where printing is required.

An explanation is hereinafter given about a method for manufacturing a piezoelectric actuator together with a method for manufacturing an ink jet printing head.

In Embodiment 2, a silicon substrate formed in an elongated shape is used in order to manufacture the head 50 for a line printer.

First, the same method as in Embodiment 1 is applied to manufacture a sol, an insulating film, a lower electrode, and a piezoelectric precursor film layer.

In a hydrothermal treatment step, if an alkaline solution is used as the treatment solution, any one of the following among KOH, $Ba(OH)_2$, $Pb(OH)_2$, a mixed solution of $Ba(OH)_2$ and $Pb(OH)_2$ a mixed solution of KOH and $Ba(OH)_2$, and a mixed solution of KOH and $Pb(OH)_2$ is used as a solution. This is because it is confirmed that piezoelectric ceramic crystallizes in these alkaline solutions.

The concentration of the alkaline solution is adjusted to be lower than 2 M[mol/l]. If the concentration is 2 M[mol/l] or higher, the alkali is strong and, therefore, there is a possibility that the piezoelectric film and the substrate may be eroded. In Embodiment 2, the concentration is adjusted to be 0.5 M[mol/l].

The temperature for the hydrothermal treatment is set in the range of 100° C. to 200° C. If the temperature is lower than the above-mentioned range, the crystallization will not be promoted. On the other hand, if the temperature is higher than the above-mentioned range, the piezoelectric film layer and the silicon substrate will be etched. The treatment temperature is set, for example, at about 140° C.

The pressure for the hydrothermal treatment is set in the range of 2 atmospheric pressure to 10 atmospheric pressure. This is because good crystals cannot be obtained if the pressure is out of the above-mentioned range. The pressure is set, for example, at about 4 atmospheric pressure. The time for the hydrothermal treatment is set from 10 minutes to 60 minutes. If the time is shorter than the above-mentioned range, sufficient crystallization can be performed. On the other hand, if the time is longer than the above-mentioned range, there is a possibility that the piezoelectric film layer or the substrate may be eroded. The treatment time is set, for example, as about 30 minutes.

Subsequently, in the same manner as in Embodiment 1, the upper electrode forming step, the etching step, the pressure chamber forming step, and the nozzle plate pasting step are performed, thereby completing the ink jet printing head 50.

As an example of the above-described manufacturing method, a piezoelectric actuator with lead zirconate titanate (Pb(Zr$_{0.56}$Ti$_{0.44}$)O$_3$) as the piezoelectric film layer is manufactured.

A piezoelectric film manufactured by a conventional complete sol-gel method is used as Comparative Example 1, and a piezoelectric film manufactured by a conventional hydrothermal method is used as Comparative Example 2. The piezoelectric film of Comparative Example 1 is manufactured by giving high-speed thermal treatment (at 650° C. for five minutes and at 900° C. for one minute) to a PZT precursor film in an amorphous state in an oxygen atmosphere.

The piezoelectric film of Comparative Example 2 is manufactured by dipping a Ti or Ni substrate in a KOH solution containing Pb$^{+2}$, Zr$^{+4}$ and Ti$^{+4}$ and by causing PZT grains to deposit.

Figure 9:
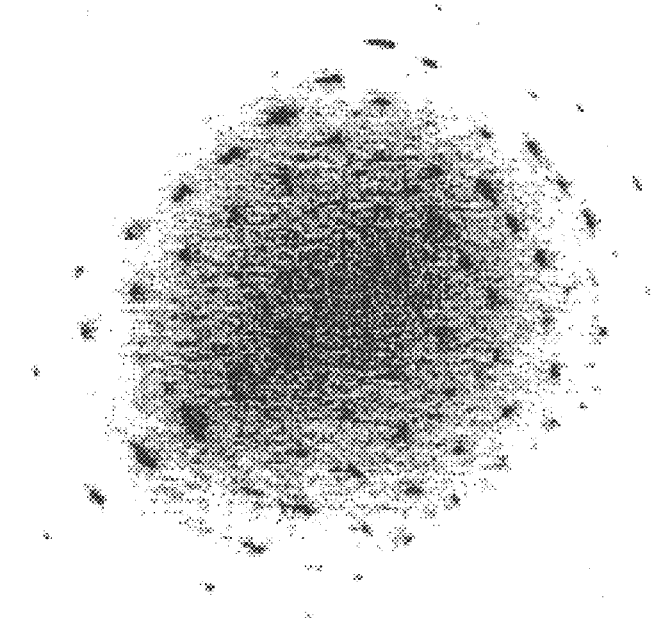
FIG. 9 a sectional transmission electron diffraction spot photograph of a piezoelectric film to which hydrothermal treatment has been given by the manufacturing method according Embodiment 2 of this invention.

FIG. 9 shows a sectional transmission electron diffraction spot photograph of the piezoelectric film layer of Embodiment 2, to which hydrothermal treatment has been given according to this invention. As can be seen in this photograph, the diffraction spots are arranged regularly and the crystallization is performed well.

According to a sectional TEM (Transmission Electron Microscopy) dark field photograph (FIG. 10) and a plan SEM (Scanning Electron Microscopy) photograph (FIG. 11) of the piezoelectric film layer, it is confirmed that the mean diameter of the columnar crystal grains is approximately in the range of 100 nm to 15000 nm.

Figure 12:
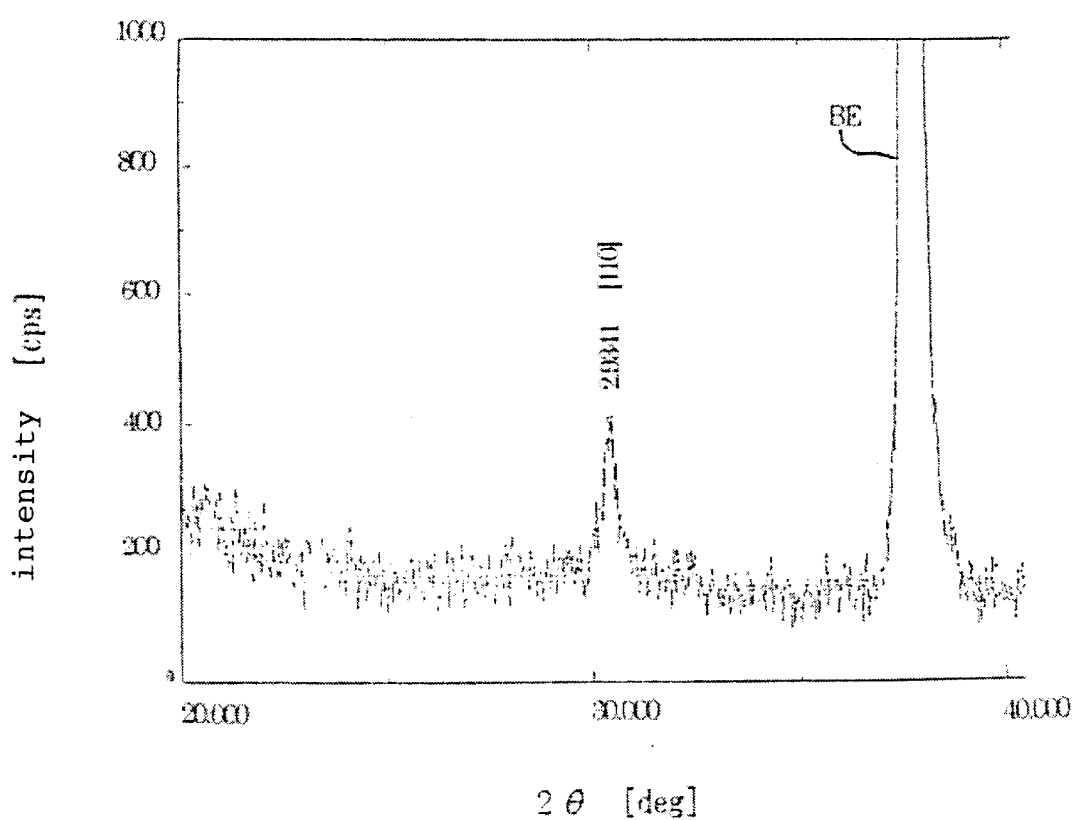
FIG. 12 a reflection X-ray diffraction spectrum of a piezoelectric film to which hydrothermal treatment has been given by the manufacturing method according to Embodiment 2 of this invention.

FIG. 12 shows a reflection X-ray diffraction (XRD) spectrum of this piezoelectric film layer. As can be seen in FIG. 12, the piezoelectric PZT film has (100) preferred orientations in direction parallel to the normal direction of lower electrode surface. According to the X-ray pole figure and the sectional transmission electron diffraction pattern, the PZT film has (100) preferred orientations in direction parallel to the normal direction of lower electrode surface.

In comparison with Comparative Example 1, the piezoelectric actuator of this embodiment can be made with a large area because there is little internal stress caused by heat. In Comparative Example 1, the internal stress generated in the film due to the crystallization is about $10^8$Pa, while the internal stress generated in the case of the piezoelectric actuator of this embodiment is about $10^6$ to $10^7$Pa. Moreover, since Comparative Example 1 adopts high-temperature thermal treatment, thermal expansion of the electrodes or the piezoelectric film occurs or their components diffuse. However, since in Embodiment 2 the crystallization is promoted by lowering temperatures, no deformation occurs due to thermal expansion and the performance of the piezoelectric actuator will not deteriorate due to the diffusion of the components. Accordingly, Embodiment 2 is expected to enhance yields and to reduce manufacturing costs.

In comparison with Comparative Example 2, only the PZT crystallization is promoted by the manufacturing method of this invention, which is adopted in Embodiment 2, the composition control of the piezoelectric film is not so difficult as is in Comparative Example 2. Moreover, with the piezoelectric actuator of Comparative Example 2, the surface roughness of its upper electrode side is 1 $\mu$m or more as a maximum height, while it is greatly improved as 0.01 $\mu$m or less with the piezoelectric actuator of Embodiment 2. Furthermore, the alkaline solution of comparatively weak degree or of low concentration is used for the manufacture, this embodiment is characterized in that the range of material selection for the electrodes and the substrate is wider than that of Comparative Example 2.

Since in Embodiment 2 the alkali concentration is low, impurities such as alkali metal cations will not enter the inside of the piezoelectric actuators to deteriorate their characteristics.

Also, crystallization can be performed at low temperatures, thereby it is easy to give treatment for the crystallization.

Moreover, since high-temperature treatment is not performed, the elements of the lower electrode will never diffuse in the piezoelectric film, thereby preventing the deterioration of the characteristics of the piezoelectric actuator.

Furthermore, since high-temperature treatment is not performed, neither changes in characteristics nor thermal stresses will be generated in the respective films, thereby enhancing the reliability of the piezoelectric actuators and the ink jet printing head.

Since the treatment solution of weak alkali or low concentration is used, it is unnecessary to select alkali-proof materials for the lower electrode or the substrate and, therefore, it is possible to expand the range of material selection.

Moreover, high-temperature treatment is not necessary and the rate of failure occurrence is low, thereby it is possible to reduce costs.

Furthermore, since no high-temperature treatment is performed and little internal stress, including thermal stress, is generated, cracks will not be generated even if the piezoelectric actuator with a large area is manufactured. In other words, it is possible to provide an ink jet printing head suitable for a large area printing device such as a line printer.

As described above, this invention makes it possible to provide a piezoelectric actuator which can be made with a large area and which has a crystal structure with flat surfaces.

It is also possible to provide an ink jet printing head which is suitable for a line printer and which comprises a piezoelectric actuator that can be made with a large area and with a flat surface.

Moreover, it is possible to provide a printer with an ink jet printing head suitable for a line printer.

Furthermore, this invention can provide a method for manufacturing a piezoelectric actuator concerning which the versatility of possible materials and options for manufacture conditions is high, and which has good performance.

It is also possible to provide a method for manufacturing an ink jet printing head with a piezoelectric actuator concerning which the versatility of possible materials and options for manufacture conditions is high, and which has good performance.

What is claimed is:

1. A piezoelectric actuator comprising:

a lower electrode;

an upper electrode; and a piezoelectric film disposed between said lower electrode and said upper electrode, wherein said piezoelectric film is made of piezoelectric ceramic, and wherein columnar crystal grains of the piezoelectric ceramic are random-oriented in a film thickness direction and a mean diameter of the columnar crystal grains is in the range of 100 nm to 15,000 nm.

2. A piezoelectric actuator according to claim 1, wherein a mean diameter of the columnar crystal grains is in the range of 100 nm to 10,000 nm.

3. A piezoelectric actuator according to claim 1, wherein the surface roughness of the upper electrode side of said piezoelectric film is 20 nm or less as a maximum height.

4. A piezoelectric actuator according to claim 1, wherein the element composition of said piezoelectric film comprises any one of the following piezoelectric ceramic materials: lead zirconate titanate ($Pb(Zr,Ti)O_3$:PZT), lead lanthanum titanate (($Pb,La)TiO_3$), lead lanthanum zirconate (($Pb,La)ZrO_3$), lead lanthanum zirconate titanate (($Pb,La)(Zr,Ti)O_3$:PLZT), and lead magnesium niobate zirconate titanate ($Pb(Mg,Nb)(Zr,Ti)O_3$:PNM-PZT).

5. An ink jet printing head with a piezoelectric actuator according to claim 1, comprising:
   a pressure chamber substrate with a pressure chamber formed therein;
   a diaphragm provided on one side of the pressure chamber; and
   the piezoelectric actuator provided on said diaphragm at the position corresponding to the pressure chamber, said piezoelectric actuator being configured to cause volume changes of the pressure chamber.

6. A printer with an ink jet printing head according to claim 5, comprising:
   a recording medium carrying mechanism configured to supply and discharge the recording media; and
   a head control circuit which causes the ink jet printing head to print at any position on the recording medium supplied by said recording medium carrying mechanism.

7. A printer with an ink jet printing head according to claim 5, comprising:
   a recording medium carrying mechanism configured to supply and discharge the recording media; and
   a head carrying mechanism which carries the ink jet printing head to any position on the recording medium supplied by said recording medium carrying mechanism.

8. A method for manufacturing a piezoelectric actuator comprising a piezoelectric film disposed between a lower electrode and an upper electrode, comprising the steps of:
   forming a precursor film in an amorphous state, containing metal and oxygen, over the lower electrode; and
   providing hydrothermal treatment to the precursor film by dipping the precursor film in a given alkaline aqueous solution to promote crystallization of the precursor film under certain conditions.

9. A method for manufacturing a piezoelectric actuator according to claim 8, wherein the alkaline aqueous solution is adjusted to obtain the concentration not higher than 2 M[mol/l] of an alkaline solute.

10. A method for manufacturing a piezoelectric actuator according to claim 8, wherein the alkaline aqueous solution is adjusted to obtain the concentration not higher than 0.5 M[mol/l] of an alkaline solute.

11. A method for manufacturing a piezoelectric actuator according to claim 8, wherein the alkaline aqueous solution is adjusted to obtain the concentration not higher than 0.1 M[mol/l] of an alkaline solute.

12. A method for manufacturing a piezoelectric actuator according to claim 8, wherein the alkaline aqueous solution is adjusted to obtain the concentration not higher than 0.05 M[mol/l] of an alkaline solute.

13. A method for manufacturing a piezoelectric actuator according to claim 8, wherein said step of forming the precursor film comprises the steps of:
   applying a sol containing organometallic compound over the lowest electrode; and
   heating the compound.

14. A method for manufacturing a piezoelectric actuator according to claim 13, wherein the step of forming the precursor is composed by repeating, at least once, the steps of:
   applying the organometallic compound solution;
   drying a film of organometallic compound, which is formed by the application, at a first temperature; and
   pyrolysing the dried organometallic compound film at a second temperature.

15. A method for manufacturing a piezoelectric actuator according to claim 8, wherein the step of forming the precursor film comprises the steps of:
   applying a precursor composed of organometallic compound over the lower electrode;
   drying the precursor at a given temperature; and
   pyrolysing the precursor at temperatures ranging from 300° C. to 500° C.

16. A method for manufacturing a piezoelectric actuator according to claim 15, wherein said pyrolysing step, comprises degreasing the precursor at a temperature of 450° C.

17. A method for manufacturing a piezoelectric actuator according to claim 15, wherein said drying step comprises driving the precursor at temperatures ranging from 150° C. to 200° C.

18. A method for manufacturing a piezoelectric actuator according to claim 15, wherein said steps of applying the precursor, the step of drying the precursor, and pyrolysing the dried precursor are repeated at least once.

19. A method for manufacturing a piezoelectric actuator according to claim 8, wherein the alkaline solution comprises any one of the following: KOH, $Ba(OH)_2$, $Pb(OH)_2$, $Ba(OH)_2+Pb(OH)_2$, $KOH\pm Ba(OH)_2$, and $KOH+Pb(OH)_2$.

20. A method for manufacturing a piezoelectric actuator according to claim 8, wherein said step of forming the precursor, comprises any one of the following methods: an RF sputtering method, an ion beam sputtering method, and an electron beam deposition method.

21. A method for manufacturing a piezoelectric actuator according to claim 8, wherein the certain conditions in the hydrothermal treatment step comprise promoting crystallization at temperatures ranging from 100° C. to 200° C. and at pressure of 10 or lower atmospheric pressure.

22. A method for manufacturing a piezoelectric actuator according to claim 8, wherein the certain conditions in the hydrothermal treatment step comprise promoting crystallization at a temperature of 140° C. and at 4 atmospheric pressure.

23. A method for manufacturing an ink jet printing head comprising a piezoelectric actuator manufactured by the manufacturing method of claim 8, wherein said method for manufacturing an ink jet printing head comprises the steps of:
   forming a diaphragm on one side of a substrate;
   manufacturing the piezoelectric actuator on the diaphragm; and
   forming a pressure chamber by etching the substrate in such arrangement that the diaphragm with the piezoelectric actuator provided thereon forms one side of the pressure chamber.

* * * * *

UNITED STATES PATENT AND TRADEMARK OFFICE
CERTIFICATE OF CORRECTION

PATENT NO. : 6,402,304 B1
DATED : June 11, 2002
INVENTOR(S) : Qiu et al.

It is certified that error appears in the above-identified patent and that said Letters Patent is hereby corrected as shown below:

Column 1,
Line 1, delete "such a" and insert -- this -- therefor.
Line 14, delete "concerning which" and insert -- such that -- therefor.
Lines 15-16, delete "upsizing of a head, and also" and insert -- the size of the head to be increased. The present invention further -- therefor.
Lines 20-21, delete "As a method for manufacturing this" and insert -- The -- therefor.
Line 21, please delete "actuator, generally employed in" and insert -- actuator is generally manufactured using -- therefor.
Line 28, please delete "By" and insert -- In -- therefor.
Line 28, please delete "which is called a" and insert -- known as the -- therefor.
Line 29, before "a Ti or Ni, insert -- discussed in further detail below, --.
Line 30, after "containing", insert -- an --.
Line 41, delete "make" and insert -- place -- therefor.
Line 53, delete "called".
Line 53, after "hydrothermal method", insert -- referenced above --.
Line 53, delete "This" and insert -- The -- therefor.

Column 2,
Line 11, delete "alkaline degree of" and insert -- degree of alkaline used for -- therefor.
Delete lines 20-23 and insert -- The present invention relates to a hydrothermal treatment which minimizes erosion for the material being treated. -- therefor.
Line 24, delete "inventors carried out experiment on" and insert -- present invention relates to -- therefor.
Line 26, delete "specifically on" and insert -- and specifically -- therefor.
Lines 28-30, delete "organomettallic compound, and then have found the manufacturing method appropriate for the practice of the above-mentioned hydrothermal method" and insert -- an organometallic compound -- therefor.
Line 31, delete "Namely, it" and insert -- It -- therefor.
Lines 31 and 34, delete "this" and insert -- the present -- therefor.
Lines 37, 40 and 44, after "object" insert -- of the present invention --.
Line 50, delete "Specifically speaking, this" and insert -- The present -- therefor.
Line 57, delete "15000" and insert -- 15,000 -- therefor.
Line 59, delete "10000" and insert -- 10,000 -- therefor.
Line 65, after "include" insert -- , but is not limited to, --.
Line 66, delete "among" and insert -- : -- therefor.

UNITED STATES PATENT AND TRADEMARK OFFICE
CERTIFICATE OF CORRECTION

PATENT NO. : 6,402,304 B1
DATED : June 11, 2002
INVENTOR(S) : Qiu et al.

It is certified that error appears in the above-identified patent and that said Letters Patent is hereby corrected as shown below:

Column 3,
Line 4, delete "this" and insert -- the present -- therefor.
Lines 5-6, delete "this invention, and such" and insert -- the invention. Such -- therefor.
Lines 13 and 21, delete "This" and insert -- The present -- therefor.
Lines 14-15, delete "invention, and such" and insert -- invention. Such -- therefor.
Lines 22-23, delete "this invention, and such" and insert -- the invention. Such -- therefor.
Lines 22-23, delete "this invention, and such" and insert -- the invention. Such -- therefor.
Line 35, delete "giving" and insert -- applying -- therefor.
Line 37, delete "and promoting the" and insert -- to promote -- therefor.
Line 39, after "As" insert -- to --.

Column 4,
Line 1, delete "among" and insert -- : -- therefor.
Line 10, delete "By" and insert -- In -- therefor.
Lines 11 and 21, delete "this" and insert -- the present -- therefor.
Line 11, delete "step" and insert -- steps -- therefor.
Line 12, delete "the step of" (both occurrences).
Line 15, delete "step" and insert -- steps -- therefor.
Lines 16 and 18, delete "the step of'.
Line 24, delete "this invention, and such" and insert -- the present invention. Such -- therefor.
Delete lines 35-37 and insert -- FIG. 1 is a perspective view of a printer according to a first embodiment of the invention -- therefor.
Lines 41 and 43, delete "Embodiment 1 of this" and insert -- the first embodiment of the -- therefor.
Line 45, delete "FIG. 5 shows" and insert -- FIGs. 5(a)-5(f) show -- therefor.
Line 47, delete "Embodiment 1 of this" and insert -- the first embodiment of the -- therefor.
Line 48, delete "FIG. 6 shows" and insert -- FIGs. 6(a)-6(c) show -- therefor.
Line 50, delete "Embodiment 1 of this" and insert -- the first embodiment of the -- therefor.
Line 65-66, delete "Embodiment 2 of this invention, and FIG. 10(b)" and insert -- the second embodiment of the invention. --
Line 67, after "photograph" and insert -- of FIG. 10(a) --.

UNITED STATES PATENT AND TRADEMARK OFFICE
CERTIFICATE OF CORRECTION

PATENT NO.   : 6,402,304 B1
DATED        : June 11, 2002
INVENTOR(S)  : Qiu et al.

Figure 11A:
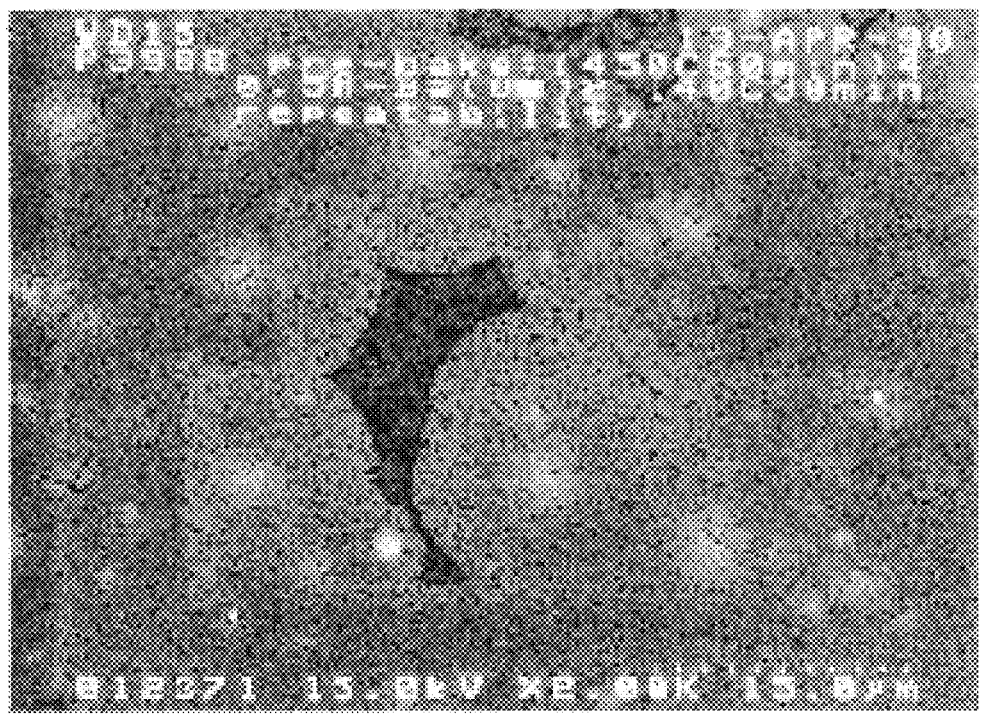
FIG. 11(a) is a plan SEM photograph of a piezoelectric film to which hydrothermal treatment has been given by the manufacturing method according to Embodiment 2 of this invention.
Figure 11B:
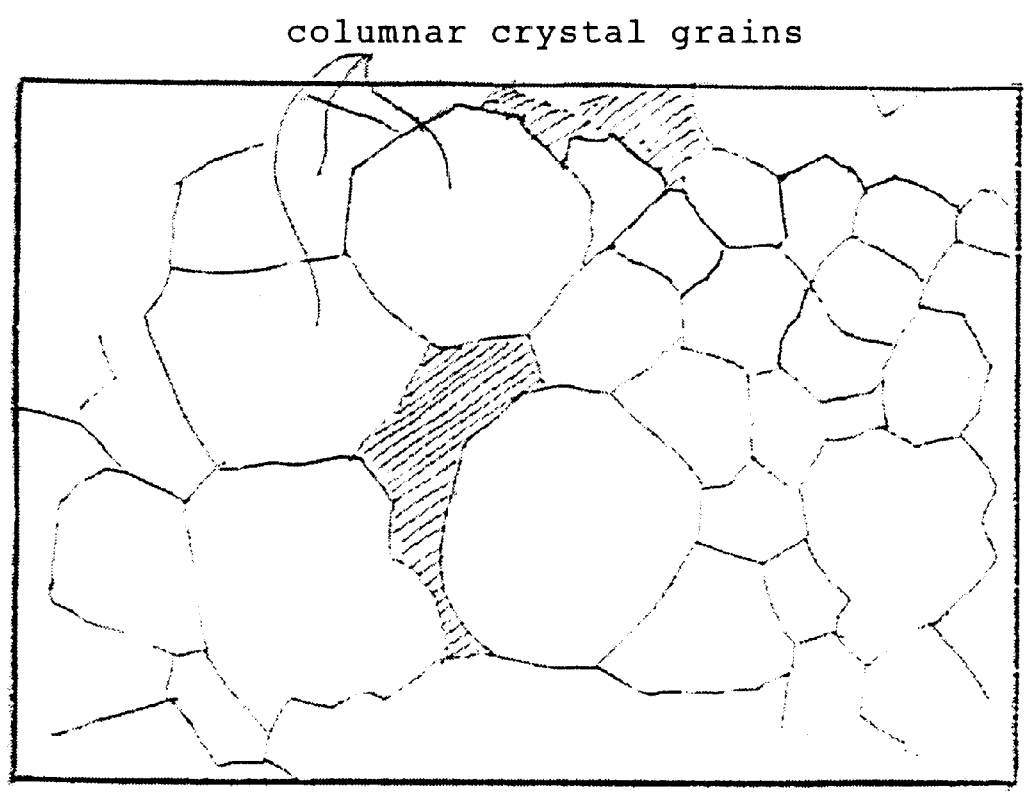
FIG. 11(b) is a traced drawing of the photograph.

It is certified that error appears in the above-identified patent and that said Letters Patent is hereby corrected as shown below:

Column 5,
Line 2, delete "given" and insert -- applied -- therefor.
Lines 3-4, delete "Embodiment 2 of this invention, and FIG. 11(b)" and insert -- the second embodiment of the invention. FIG. 11(b) -- therefor.
Line 5, after "photograph" and insert -- of FIG. 11(a) --.
Line 8, delete "given" and insert -- applied -- therefor.
Lines 8-9, delete "Embodiment 2 of this" and insert -- the second embodiment of the -- therefor.
Line 15, delete "utilized" and insert -- manufactured according to -- therefor.
Line 18, delete "(Embodiment 1)" and insert -- Embodiment 1 -- therefor
Line 21, delete "Embodiment 1 of this" and insert -- a first embodiment of the -- therefor.
Line 23, delete "Embodiment 1 has" and insert -- the first embodiment includes -- therefor.

Column 6,
Line 16, delete "given" and insert -- provided -- therefor.
Line 22, delete "The cavity" and insert -- Each cavity 21 -- therefor.
Line 32, delete "be" and insert -- are -- therefor.
Line 39, after "thereon" insert -- as shown in FIG. 3 --.
Lines 43-44, delete "specific structures".

Column 7,
Line 3, delete "composing" and insert -- of -- therefor.
Line 4, after "is" insert -- formed of --.
Line 6, delete "this" and insert -- the present -- therefor.
Line 9, delete "the lower part of FIG. 11" and insert -- FIG. 11 (b) -- therefor.
Line 9, delete "the lower part of FIG. 11" and insert -- FIG. 11 (b) -- therefor.
Line 16, after "grains" insert -- , as shown in the exploded view in FIG. 4 --.
Line 17, delete "15000" and insert -- 15,000 -- therefor.
Line 18, delete "10000" and insert -- 10,000 -- therefor.
Line 22, delete "among" and insert -- : -- therefor.
Line 27, delete "given" and insert -- provided -- therefor.

Column 8,
Line 1, delete "FIG. 5 shows" and insert -- FIGS. 5(a)-5(f) show -- therefor.
Line 17, delete "FIGS. 5(c)(d)" and insert -- FIGS. 5(c) and (d) -- therefor.
Line 36, delete "an air at" and insert -- air having -- therefor.

UNITED STATES PATENT AND TRADEMARK OFFICE
CERTIFICATE OF CORRECTION

PATENT NO.    : 6,402,304 B1
DATED         : June 11, 2002
INVENTOR(S)   : Qiu et al.

It is certified that error appears in the above-identified patent and that said Letters Patent is hereby corrected as shown below:

Column 9,
Line 29, delete "among" and insert -- can be used as a solute: -- therefor.
Line 32, delete "is used as a solute".
Line 38, delete "Embodiment 1" and insert -- the first embodiment -- therefor.
Line 55, delete "can" and insert -- cannot -- therefor.

Column 10,
Line 5, delete "FIG. 6" and insert -- FIGS. 6(a)-6(c) -- therefor.
Line 58, after "A" insert -- traced drawing of a --.
Lines 59-61, delete "is taken. FIG. 7 is a traced drawing of this sectional SEM photograph"

Column 11,
Line 1, delete "respective" and insert -- respect -- therefor.
Line 8, delete "Embodiment 1" and insert -- the first embodiment -- therefor.
Lines 51-52, delete "new use which conventional products cannot afford, and to provide" and insert -- new uses which may be too costly to be used in conventional products. Further, the piezoelectric actuator of the present invention can provide -- therefor.
Line 54, delete "(Embodiment 2)" and insert -- Embodiment 2 -- therefor.
Line 55, delete "Embodiment 2 of this invention" and insert --the second embodiment of the present invention -- therefor.
Line 56, delete "explained by referring to the attached drawings" and insert -- explained with reference to FIG. 8 -- therefor.
Lines 57 and 60, delete "Embodiment 2" and insert -- the second embodiment -- therefor.
Line 58, delete "Embodiment 1" and insert -- the first embodiment -- therefor.

Column 12,
Lines 16 and 28, delete "Embodiment 2" and insert -- the second embodiment -- therefor.
Lines 17 and 20, delete "Embodiment 1 " and insert -- the first embodiment -- therefor.
Lines 31 and 66, delete "Embodiment 1" and insert -- the first embodiment -- therefor.
Line 35, delete "among" and insert -- can be used as a solution: -- therefor.
Lines 38-39, delete "is used as a solution".
Line 45, delete "Embodiment 2" and insert -- the second embodiment -- therefor.
Line 61, delete "can" and insert -- cannot -- therefor.

UNITED STATES PATENT AND TRADEMARK OFFICE
CERTIFICATE OF CORRECTION

PATENT NO. : 6,402,304 B1
DATED : June 11, 2002
INVENTOR(S) : Qiu et al.

Figure 10A:
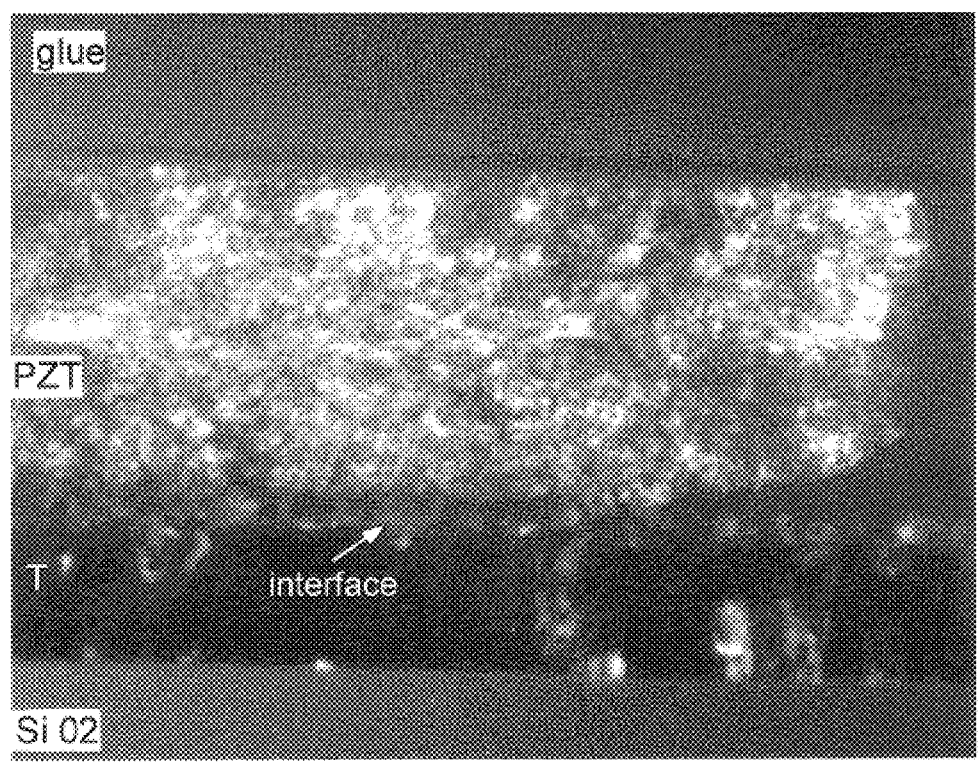
FIG. 10(*a*) is a sectional TEM dark field photograph of a piezoelectric film to which hydrothermal treatment has been given by the manufacturing method according to Embodiment 2 of this invention, and FIG. 10(*b*) is a traced drawing of the photograph.
Figure 10B:
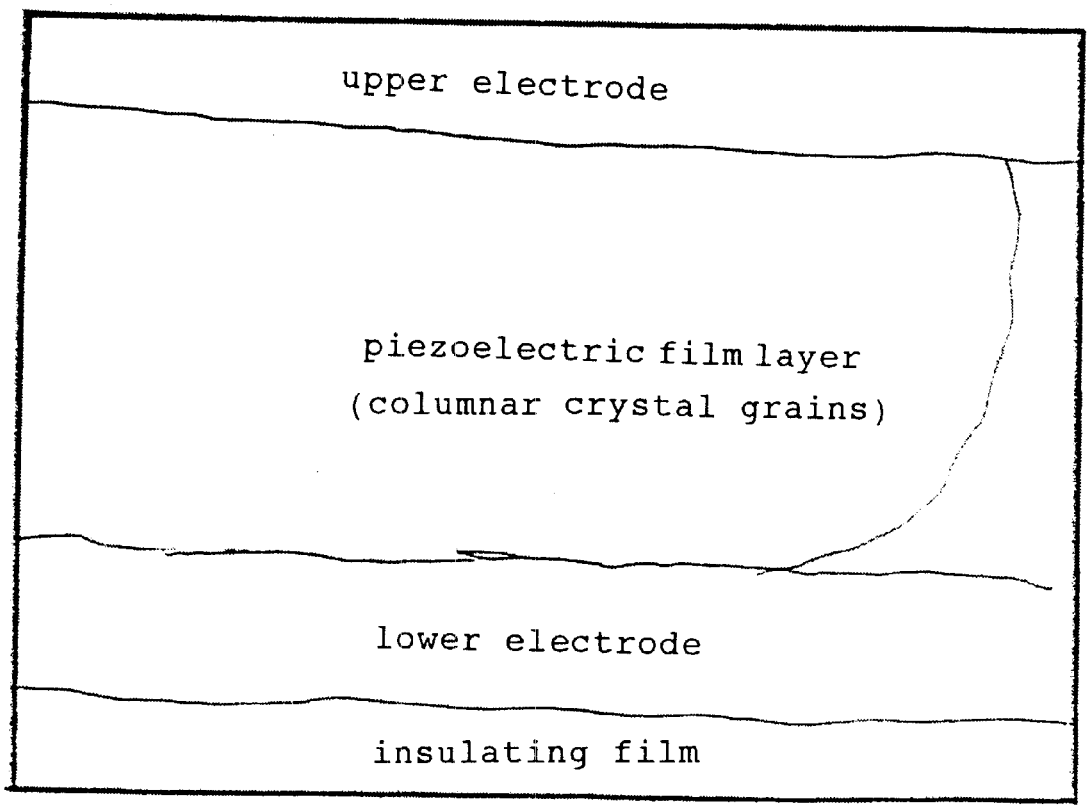

It is certified that error appears in the above-identified patent and that said Letters Patent is hereby corrected as shown below:

Column 13,
Lines 22-23, delete "Embodiment 2" and insert -- the second embodiment -- therefor.
Line 27, delete "sectional" and insert -- cross-sectional -- therefor.
Line 28, delete "(FIG. 10)" and insert -- , as shown in FIGS. 10(a) and 10(b), -- therefor.
Line 29, delete "(FIG. 11)" and insert -- , as shown in FIGS. 11(a) and 11(b), -- therefor.
Line 32, delete "15000" and insert -- 15,000 -- therefor.
Lines 35 and 39, delete "(100)" and insert -- (110) -- therefor.
Lines 51 and 55, delete "Embodiment 2" and insert -- the second embodiment -- therefor.
Lines 60-61 and 66, delete "Embodiment 2" and insert -- the second embodiment -- therefor.
Line 67, after "Furthermore," insert -- because -- .

Column 14,
Line 5, delete "Embodiment 2" and insert -- the second embodiment -- therefor.
Line 46, delete "this invention can provide" and insert -- the present invention provides -- therefor.
Line 47, delete "concerning" and insert -- by -- therefor.
Line 50, delete "It is also possible to provide" and insert -- The present invention also provides -- therefor.

Column 16,
Line 2, delete "lowest" and insert -- lower -- therefor.
Line 28, delete "driving" and insert -- drying -- therefor.
Line 32, delete "the steps of".

Signed and Sealed this

Fifteenth Day of April, 2003

JAMES E. ROGAN
*Director of the United States Patent and Trademark Office*

UNITED STATES PATENT AND TRADEMARK OFFICE
CERTIFICATE OF CORRECTION

PATENT NO.     : 6,402,304 B1
DATED          : June 11, 2002
INVENTOR(S)    : Hong Qiu et al.

It is certified that error appears in the above-identified patent and that said Letters Patent is hereby corrected as shown below:

Delete specifications, Columns 1-16 and substitute the following.

Signed and Sealed this

Eleventh Day of April, 2006

JON W. DUDAS
*Director of the United States Patent and Trademark Office*

PIEZOELECTRIC ACTUATOR, INK JET PRINTING HEAD, PRINTER, METHOD FOR MANUFACTURING PIEZOELECTRIC ACTUATOR, AND METHOD FOR MANUFACTURING INK JET PRINTING HEAD

BACKGROUND OF THE INVENTION

1. Field of the Invention

The present invention relates to a piezoelectric actuator used for, for example, an ink jet printing head. More particularly, this invention relates to a method for manufacturing a piezoelectric actuator, such that the internal stress is extremely relaxed, and which permits the size of a head to be increased. The present invention further relates to a product made by this manufacturing method.

2. Related Art

A piezoelectric actuator is a device having an electromechanical transducing function and is composed of crystallized piezoelectric ceramic. The piezoelectric actuator is generally manufactured using a so-called sol-gel method of applying a sol of organometallic compound over an electrode, drying and pyrolysing the sol, and giving high temperature treatment to cause crystallization, which is followed by a method of causing instant crystallization with high heat.

In another crystallation method known as the "hydrothermal method," discussed in further detail below, a Ti or Ni substrate is dipped in a KOH solution containing an organometallic compound, thereby causing PZT grains to deposit.

However, when the piezoelectric actuator is manufactured by the sol-gel method, there is a problem in that thermal stress occurs and cracks are easily made in a piezoelectric film. Accordingly, it has been difficult to manufacture a piezoelectric actuator with a large area. For example, it has been impossible to manufacture a piezoelectric actuator for a line printer.

Moreover, a piezoelectric actuator manufactured by the conventional hydrothermal method has a rough surface and, therefore, it has been difficult to place an upper electrode in good contact with the piezoelectric actuator.

The research paper on "Application of Hydrothermal Mechanism for Tailor-making Perovskite Titanate Films," IEEE Proc. of the 9th International Symposium on Electrets, Shanghai, China (held on September 25 through September 30) (pp. 617–622) (1996), which was prepared by W-ping Xu, Masanori Okuyama, et al., describes a method of causing a precursor film of piezoelectric ceramic to crystallize by putting the precursor film, which has been applied over a substrate and has been dried, in a given alkaline solution. This method of causing crystallization in an alkaline solution is the hydrothermal method referenced above. The hydrothermal method enables the crystallization at comparatively lower temperatures than in the case of the sol-gel method, thereby giving rise to several advantages. For example, since the low temperature manufacturing results in less internal stress, including thermal stress, generated in the film in the course of crystallization, it is considered to be possible to form a piezoelectric film with a larger area than a conventional piezoelectric film.

The above-mentioned research paper states that an alkaline treatment solution is used for the hydrothermal treatment.

However, there is a problem in that silicon, which is suitable for fine processing as a material for a pressure chamber substrate, or the piezoelectric film layer itself is easily soluble in a strong alkaline treatment solution such as KOH. Therefore, when silicon is used for the substrate, it is necessary to use a weak alkaline solution prepared by adding Ba, such as barium hydroxide, to the strong alkaline solution, or to adjust treatment conditions. Particularly, when it is necessary to apply fine processing to a substrate for which silicon is used, even the use of the weak alkaline treatment solution containing Ba may cause slight erosion and, therefore, it is considered to cause inconvenience. It is desirable that the degree of alkaline used for the treatment solution be as low as possible.

Moreover, the above-mentioned research paper does not include sufficient descriptions about the manufacture of a piezoelectric actuator with good characteristics, which is suitable for an ink jet printing head for a printer.

SUMMARY OF THE INVENTION

The present invention relates to a hydrothermal treatment which minimizes erosion of the material being treated.

Moreover, the present invention relates to the manufacture of piezoelectric actuators by the hydrothermal method, and specifically the conditions for manufacturing the entire piezoelectric actuators, including the application of a sol composed of an organometallic compound.

It is an object of the present invention to provide a piezoelectric actuator which can be made with a large area and which has a crystal structure with flat surfaces.

It is another object of the present invention to provide an ink jet printing head which is suitable for a line printer and which comprises a piezoelectric actuator that can be made with a large area and with a flat surface.

It is still another object of the present invention to provide a printer which comprises an ink jet printing head suitable for a line printer.

It is a further object of the present invention to provide a method for manufacturing a piezoelectric actuator concerning which there is a wide selection of possible materials and options for manufacture conditions, and which has good performance.

It is a still further object of the present invention to apply the above-mentioned method for manufacturing the piezoelectric actuator and to provide a method for manufacturing an ink jet printing head concerning which there is a wide selection of possible materials and options for manufacture conditions, and which has good performance.

The present invention provides a piezoelectric actuator which comprises: a lower electrode; an upper electrode; and a piezoelectric film held between the lower electrode and the upper electrode, wherein the piezoelectric film is made of piezoelectric ceramic, and columnar crystal grains of the piezoelectric ceramic are random-oriented in a film thickness direction and a mean diameter of the columnar crystal grains is in the range of 100 nm to 15,000 nm.

It is desirable that a mean diameter of the columnar crystal grains be in the range of 100 nm to 10,000 nm.

The surface roughness of the upper electrode side of the piezoelectric film can be set at 20 nm or less as a maximum height.

The element composition of the piezoelectric film can include, but is not limited to, any one of the following piezoelectric ceramic materials: lead zirconate titanate (Pb$(Zr,Ti)O_3$:PZT), lead lanthanum titanate ((Pb,La)$TiO_3$), lead lanthanum zirconate ($(Pb,La)ZrO_3$), lead lanthanum zirconate titanate ($(Pb,La)(Zr,Ti)O_3$:PLZT), and lead magnesium niobate zirconate titanate ($Pb(Mg,Nb)(Zr,Ti)O_3$:PMN-PZT).

Moreover, the present invention provides an ink jet printing head with a piezoelectric actuator according to the invention. Such an ink jet printing head comprises: a pressure chamber substrate with a pressure chamber formed therein; a diaphragm provided on one side of the pressure chamber; and the piezoelectric actuator provided on the diaphragm at the position corresponding to the pressure chamber, wherein the piezoelectric actuator is composed to be capable of causing volume changes of the pressure chamber.

The present invention also provides a printer with the above-described ink jet printing head according to this invention. Such a printer comprises: a recording medium carrying mechanism composed to be capable of supplying and taking out the recording media; and a head control circuit for causing the ink jet printing head to print at any position on the recording medium supplied by the recording medium carrying mechanism.

The present invention further provides a printer with the above-described ink jet printing head according to the invention. Such a printer comprises: a recording medium carrying mechanism composed to be capable of supplying and taking out the recording media; and a head carrying mechanism for carrying the ink jet printing head to any position on the recording medium supplied by the recording medium carrying mechanism.

Furthermore, the present invention provides a method for manufacturing a piezoelectric actuator comprising a piezoelectric film held between a lower electrode and an upper electrode, wherein the method comprises the steps of: forming a precursor film in an amorphous state, containing metal and oxygen, over the lower electrode; and applying hydrothermal treatment to the precursor film by dipping the precursor film in a given alkaline solution to promote crystallization under certain conditions.

As to the above-described alkaline solution, a solution adjusted to contain an alkaline solute of concentration not higher than 2M[mol/l] can be used. Preferably, a solution adjusted to contain the alkaline solute of concentration not higher than 0.5M[mol/l] should be used. More preferably, a solution adjusted to contain the alkaline solute of concentration not higher than 0.1M[mol/l] should be used. Most preferably, a solution adjusted to contain the alkaline solute of concentration not higher than 0.05M[mol/l] should be used.

In the step of forming the precursor film, the precursor film in the amorphous state can be formed by applying a sol containing organometallic compound over the lower electrode and by heating it.

Moreover, the step of forming the precursor film can comprise the steps of: applying a precursor composed of organometallic compound; drying the precursor at a given temperature; pyrolysing the precursor at temperatures ranging from 300° C. to 500° C.

The alkaline solution can be selected from the group consisting of KOH, $Ba(OH)_2$, $Pb(OH)_2$, $Ba(OH)_2+Pb(OH)_2$, $KOH+Ba(OH)_2$, and $KOH+Pb(OH)_2$.

In the pyrolysing step, the precursor can be degreased at a temperature of 450° C.

In the drying step, the precursor can be dried at temperatures ranging from 150° C. to 200° C.

In the step of forming the precursor, the precursor film in the amorphous state containing metal and oxygen can be formed by any one of the following methods: an RF sputtering method, an ion beam sputtering method, and an electron beam deposition method.

The certain conditions in the hydrothermal treatment step can be set at temperatures ranging from 100° C. to 200° C. and at 10 or lower atmospheric pressure.

The certain conditions in the hydrothermal treatment step can be set at a temperature of 140° C. and at 4 atmospheric pressure.

In the method for manufacturing a piezoelectric actuator according to the present invention, the steps applying the precursor, drying the precursor, and pyrolysing the dried precursor can be repeated at least once.

In the step of forming the precursor, the steps of applying the organometallic compound solution, drying a film of organometallic compound, which is formed by the application, at a first temperature, and pyrolysing the dried organometallic compound film at a second temperature can be repeated at least once.

Furthermore, the present invention provides a method for manufacturing an ink jet printing head comprising a piezoelectric actuator manufactured by the above-described manufacturing method according to the present invention. Such a method for manufacturing an ink jet printing head comprises the steps of: forming a diaphragm on one side of a substrate; manufacturing the piezoelectric actuator on the diaphragm; and forming a pressure chamber by etching the substrate in such arrangement that the diaphragm with the piezoelectric actuator provided thereon forms one side of the pressure chamber.

BRIEF DESCRIPTION OF THE FIGURES

FIG. 1 is a perspective view of a printer according to a first embodiment of the invention.

FIG. 2 is an exploded perspective view of an ink jet printing head according to the first embodiment of the invention.

FIG. 3 is a partial sectional perspective view of the ink jet printing head according to the first embodiment of the invention.

FIG. 4 is a sectional view of a piezoelectric actuator according to the first embodiment of the invention, which illustrates the layer structure of the piezoelectric actuator.

FIGS. 5(a)–5(f) show sectional views of manufacturing steps, which illustrate a method for manufacturing the piezoelectric actuator according to the first embodiment of the invention.

FIGS. 6(a)–6(c) show a sectional view of manufacturing steps which illustrate a method for manufacturing the ink jet printing head according to the first embodiment of the invention.

FIG. 7 is a traced drawing of a sectional SEM photograph of a piezoelectric film to which hydrothermal treatment has been applied by the manufacturing method according to the first embodiment of the invention.

FIG. 8 is a perspective view of a printer according to a second Embodiment of the invention.

FIG. 9 is a sectional transmission electron diffraction spot photograph of a piezoelectric film to which hydrothermal treatment has been applied by the manufacturing method according to the second embodiment of the invention.

FIG. 10(a) is a sectional TEM dark field photograph of a piezoelectric film to which hydrothermal treatment has been applied by the manufacturing method according to the second embodiment of the invention.

FIG. 10(b) is a traced drawing of the photograph of FIG. 10(a).

FIG. 11(a) is a plan SEM photograph of a piezoelectric film to which hydrothermal treatment has been applied by the manufacturing method according to the second Embodiment of the invention.

FIG. 11(b) is a traced drawing of the photograph of FIG. 11(a).

FIG. 12 is a reflection of X-ray diffraction spectrum of a piezoelectric film to which hydrothermal treatment has been applied by the manufacturing method according to the second embodiment of the invention.

DETAILED DESCRIPTION OF THE PREFERRED EMBODIMENTS

Embodiments of this invention are hereinafter explained by referring to the attached drawings. These embodiments relate to a piezoelectric actuator manufactured according to a hydrothermal method, and to an inkjet printing head and a printer which use the piezoelectric actuator.

Embodiment 1

An explanation is first given about the structure of a printer on which an ink jet printing head having a piezoelectric actuator according to a first embodiment of the invention is used.

As shown in FIG. 1, a printer of the first embodiment includes a tray 3, an outlet 4, and an operation button 9, which are provided on a main body 2. Inside the main body 2 are provided an ink jet printing head 1, a feeding mechanism 6, a head controlling mechanism 7, and a control circuit 8.

The ink jet printing head 1 comprises a piezoelectric actuator manufactured by a manufacturing method of this invention. As shown as an enlarged view in a circle, the inkjet printing head 1 comprises heads 1bk, 1c, 1m and 1y, each of which has the same structure.

Each head is constructed to be capable of discharging ink from its nozzle in response to a discharge signal supplied from the control circuit 8. The head 1bk discharges black ink, the head 1c discharges cyan ink, the head 1m discharges magenta ink, and the head 1y discharges yellow ink. However, if no color printing is required, the ink jet printing head may be composed of, for example, only black ink. Specific structure of the head will be described later.

The main body 2 is a housing for the head 1 and has the feeding mechanism 6 located at a position which makes it possible to feed paper 5 from the tray 3, and also has the ink jet printing head 1 located at a position which makes it possible to pass over and across the paper 5. The tray 3 is composed to be capable of feeding the paper 5 before print to the feeding mechanism 6, and the outlet 4 is an outlet for outputting the paper 5 which has been printed.

The feeding mechanism 6 comprises a motor 600, rollers 601 and 602, and a mechanical structure not shown in the drawing. The motor 600 is rotatable in response to a drive signal supplied from the control circuit 8. The mechanical structure is composed to be capable of transmitting the torque of the motor 600 to the rollers 601 and 602. The rollers 601 and 602 are designed to rotate as the torque of the motor 600 is transmitted to them. The rotation of the rollers draw in the paper 5 placed on the tray 3 and the paper 5 is then fed so that printing can be performed by the head 1.

The head controlling mechanism 7 comprises a motor 700 and a mechanical structure not shown in the drawing. The motor 700 is designed to be rotatable in response to a head moving signal supplied from the control circuit 8. The mechanical structure concerts the rotational motion of the motor 7 into horizontal movement, so that the ink jet printing head 1 can be moved in directions indicated by the arrows in FIG. 1. However, if the ink jet printing head 1 is formed with such a large area that it can cover the widthwise direction of the paper (for example, in the case of a line printer), it is unnecessary to move the head itself. In other words, the head moving mechanism is not an essential component.

Although it is not shown in the drawing, the control circuit 8 comprises a CPU, a ROM, a RAM, an interface circuit, and the like. The control circuit 8 supplies the drive signal to the feeding mechanism 6 in response to print information supplied from a computer through a connector not shown in the drawing, supplies the head moving signal to the head controlling mechanism 7, and supplies the discharge signal to the ink jet printing head 1. The control circuit 8 is also designed to be capable of setting and resetting operation modes in response to an operation signal sent from an operation panel 9.

An explanation is hereinafter provided about the structure of the ink jet printing head of this invention. As shown in FIGS. 2 and 3, the ink jet printing head 1 comprises a nozzle plate 10, a pressure chamber substrate 20, a diaphragm 30, and a housing 25. The pressure chamber substrate 20 comprises cavities 21, side walls (partitions) 22, a reservoir 23, and supply ports 24. Each cavity 21 is a pressure chamber which is formed by etching the substrate made of silicon or the like and which serves as a space for storing ink or the like to be discharged. The side walls 22 are formed so as to partition the cavities 21. The reservoir 23 is a common channel for filling the respective cavities 21 with ink. The supply ports 24 are formed to be capable of introducing ink from the reservoir 23 to the respective cavities 21.

The nozzle plate 10 is pasted to one side of the pressure chamber substrate 20 in a manner such that nozzle holes 11 are located at positions corresponding to the respective cavities 21 provided in the pressure chamber substrate 20. The pressure chamber substrate 20 on which the nozzle plate 10 is pasted is then placed in the housing 25 as shown in FIG. 2, thereby composing the ink jet printing head 1.

The diaphragm 30 is pasted to the other side of the pressure chamber substrate 20. The diaphragm 30 has the piezoelectric actuator 40 mounted thereon as shown in FIG. 3. In the diaphragm 30, there is an ink tank hole 31 capable of supplying ink stored in an ink tank (not shown) to the inside of the pressure chamber substrate 20.

FIG. 4 is a sectional view illustrating more of the ink jet printing head and the piezoelectric actuator of this invention.

As shown in FIG. 4, the diaphragm 30 is composed by laminating an insulating film 31 and a lower electrode 32. The piezoelectric actuator 40 is composed by laminating a piezoelectric film layer 41 and an upper electrode 42.

The insulating film 31 is composed of a nonconductive material such as silicon dioxide prepared by, for example, thermally oxidizing a silicon substrate. The insulating film 31 deforms due to the deformation of the piezoelectric layer and is composed to be capable of momentarily increasing the internal pressure of the cavity 21.

The lower electrode 32 is one electrode for applying voltage on the piezoelectric layer and is composed of a conductive material such as titanium (Ti). The lower electrode 32 is formed in the same area as that of the insulating film 31 so that it functions as a common electrode for a plurality of piezoelectric actuators formed over the pressure chamber substrate 20. However, it is also possible to form the lower electrode 32 in the same size as that of the piezoelectric film layer 41, that is, in the same shape as that of the upper electrode.

The upper electrode 42 is the other electrode for applying voltage on the piezoelectric layer and is composed of a conductive material such as platinum (Pt) with a film thickness of 0.1 µm.

The piezoelectric film layer 41 of the piezoelectric actuator 40 is formed of crystals of piezoelectric ceramic which have a perovskite structure and which are manufactured by the manufacturing method of the present invention. The piezoelectric film layer 41 is formed in a given shape over the diaphragm 30. Specifically, as can be seen in the enlarged view shown in FIG. 11(b), the piezoelectric film layer 41 of this invention is characterized in that its crystal grains in columnar shapes (columnar crystal grains) are random-oriented where crystal orientation is inconstant. Moreover, the piezoelectric film layer 41 is characterized in that the width of these columnar crystal grains in a direction parallel to the surface of the electrode film, that is, a mean diameter d of the columnar crystal grains, as shown in the exploded view in FIG. 4, is in the range of 100 nm to 15,000 nm, more preferably, in the range of 100 nm to 10,000 nm. The piezoelectric film layer 41 having the structure of such characteristics can be formed by applying the hydrothermal method of this invention.

The element composition of the piezoelectric film layer 41 includes, for example, any one of the following piezoelectric ceramic: lead zirconate titanate ($Pb(Zr,Ti)O_3$:PZT), lead lanthanum titanate ($(Pb,La)TiO_3$), lead lanthanum zirconate ($(Pb,La)ZrO_3$), lead lanthanum zirconate titanate ($(Pb,La)(Zr,Ti)O_3$:PLZT), and lead magnesium niobate zirconate titanate ($Pb(Mg,Nb)(Zr,Ti)O_3$:PMN-PZT).

An explanation is hereinafter provided about the principle of ink drop discharge in the structure of the ink jet printing head.

When the discharge signal is not supplied from the control circuit 8 and no voltage is applied between the lower electrode 32 and the upper electrode 42 of the piezoelectric actuator 40, the piezoelectric film layer 41 will not deform. No pressure change will occur in the cavity 21 on which the piezoelectric actuator 40 without any discharge signal supplied thereto is provided, and no ink drops will be discharged from its nozzle hole 11.

On the other hand, if the discharge signal is supplied from the control circuit 8 and constant voltage is applied between the lower electrode 32 and the upper electrode 42 of the piezoelectric actuator 40, the piezoelectric film layer 41 deforms. In the cavity 21 on which the piezoelectric actuator 40 with the discharge signal supplied thereto is provided, the diaphragm 30 deflects considerably. Accordingly, the pressure within the cavity 21 increases momentarily, thereby discharging ink drops from the nozzle hole 11.

An explanation is hereinafter given about the method for manufacturing the piezoelectric actuator together with the method for manufacturing the ink jet printing head.

Sol Manufacture

A sol of piezoelectric ceramic is first manufactured, which is the material for the piezoelectric film layer. For example, titanium tetraisopropoxide, niobium pentaethoxide and zirconium tetra-n-propoxide are mixed in 2-n-butoxyethanol, and the mixture is then stirred for 20 minutes at room temperature. Subsequently, diethanolamine is added to the mixture, which is further stirred for 20 minutes at room temperature. Lead acetate and magnesium acetate are added to the mixture, which is then heated up to 80° C. The obtained mixture in the heated state is stirred for 20 minutes and is then left to cool itself until it reaches room temperature. The metal alkoxide solution manufactured in the above-described steps is to be used as the sol. However, the method for manufacturing the sol is not limited to the above-described method.

The sol manufactured by the above-described method is used to manufacture the piezoelectric actuator and the ink jet printing head.

FIGS. 5(a)–5(f) show sectional views illustrating the steps of manufacturing the piezoelectric actuator.

Insulating Film Forming Step (FIG. 5(a))

The insulating film forming step is the step of forming the insulting film 31 on the silicon substrate 20. The silicon substrate 20 is formed, for example, with a thickness of about 200 µm and the insulating film 31 is formed with a thickness of about 1 µm. Known thermal oxidization or the like is employed for the manufacture of the insulating film.

Lower Electrode Forming Step (FIG. 5(b))

The lower electrode forming step is the step for forming the lower electrode 32 over the insulating film 31. The lower electrode 32 is made by, for example, laminating a titanium layer with a thickness of 0.1 µm. Known DC sputtering or the like is employed for the manufacture of such a layer.

Step of Forming a Precursor Film for the Piezoelectric Film Layer (FIGS. 5(c) and 5(d))

The step of forming a precursor film for the piezoelectric film layer is the step of repeating the application of a sol, and drying and pyrolysing of the applied sol, thereby forming a precursor film made of a plurality of thin films.

Firstly, the metal alkoxide which has been manufactured in the manner described above is applied in a uniform thickness over the lower electrode 32. If known spin coating is employed, for example, the application is performed for 30 seconds at 500 rpm, for 30 seconds at 1500 rpm, and lastly for 10 seconds at 500 rpm. At the applied stage, respective metal atoms composing PZT are dispersed as organometallic compound.

After the application, the sol is dried for a certain period of time at a constant temperature, for example, preferably in the range of 150° C. to 200° C., more preferably at about 180° C. The drying time is, for example, preferably from five minutes to 15 minutes, and more preferably about 10 minutes. Drying causes moisture to evaporate.

After the drying, pyrolysing is performed in air having a constant temperature, for example, preferably in the range of 300° C. to 500° C., and more preferably at 450° C. for a certain period of time (60 minutes). The pyrolysing causes an organic substance, which forms coordinate or covalent bond with metal, to dissociate from the metal, and the organic substance initiates an oxidation combustion reaction and shatters in the atmosphere. The precursor film that is left after the pyrolysing is an amorphous film which consists of only the metal and oxygen. The above-described respective steps of application, drying and pyrolysing are repeated for a given number of times, for example, four times, thereby laminating four thin film layers (411, 412, etc.). The multi-layered structure is intended to prevent the generation of cracks and to increase the film thickness.

The step of forming the precursor film for the piezoelectric film can be replaced with the step utilizing a sputtering method. For example, any one of the following methods among RF (Radio Frequency) sputtering, ion beam sputtering, electron beam deposition and the like is employed to manufacture the thin film layers 411, 412, etc., in the block, which form the precursor film. Then, as the sputtering is performed under certain conditions, for example, by using a sputter target including Pb, Zr, Ti, Mg, Nb and the like, with 500W sputtering power, with 4Pa argon gas pressure during the sputtering, with no heating of the substrate during the sputtering, and the sputtering time being 80 minutes. As a result, the precursor film with a thickness of about 1000 nm can be obtained. Of course, the precursor film obtained by the sputtering contains no organic substance. Just like the precursor film formed by applying the above-described sol, and drying and pyrolysing the applied sol, this precursor film which is formed by the sputtering and which contains no organic substance is composed of only the metal and oxygen which are the direct elements for forming the piezoelectric film. Accordingly, it is possible to cause crystallization by means of phase changes made by the hydrothermal treatment as described later. If any organic substance remains in the precursor film, the organic substance may disturb crystallization. Consequently, the hydrothermal treatment which utilizes a low alkaline solution is performed on the condition that the precursor film contains no organic substance.

If it is required to crystallize a precursor film containing organic substances to make the piezoelectric film, it is necessary to give the hydrothermal treatment in an alkaline solution of not lower than a certain concentration. This is because the organic substance, which forms coordinate or covalent bond with metal, dissolves and departs because of alkali and the metal atom ionizes, and the ionized metal disperses and crystallizes because of the action of pressure and temperatures. In other words, pyrolysing with alkali is required.

Hydrothermal Treatment Step (FIG. 5(e))

The hydrothermal treatment step is the step characteristic of this invention. A tank 100 is first filled with an alkalescent solution 101. Then, the precursor film 41 laminated in the above-described step together with the substrate is put in the tank 100 to promote the crystallization under certain conditions in an autoclave.

If an alkaline solution is used as the treatment solution, any one of the following can be used as a solute: KOH, $Ba(OH)_2$, $Pb(OH)_2$, a mixed solution of $Ba(OH)_2$ and $Pb(OH)_2$, a mixed solution of $Ba(OH)_2$ and KOH, and a mixed solution of KOH and $Pb(OH)_2$. This is because it is confirmed that the precursor film of piezoelectric ceramic crystallizes in these alkaline solutions.

As for the concentration of the alkaline solution, it is desirable in terms of the possibility of erosion of the substrate or the like that the concentration be adjusted to be lower than 0.1 M[mol/l]. In the first embodiment, the concentration is adjusted to be 0.05 M[mol/l].

The temperature for the hydrothermal treatment is set in the range of 100° C. to 200° C. If the temperature is lower than the above-mentioned range, the crystallization will not be promoted. On the other hand, if the temperature is higher than the above-mentioned range, the precursor film or the piezoelectric film layer and the silicon substrate will be etched. The treatment temperature is set, for example, at about 140° C.

The pressure for the hydrothermal treatment is set in the range of 2 atmospheric pressure to 10 atmospheric pressure. This is because good crystals cannot be obtained if the pressure is out of the above-mentioned range. The pressure is set, for example, at about 4 atmospheric pressure. The time for the hydrothermal treatment is set in the range of 10 minutes to 60 minutes. If the time is shorter than the above-mentioned range, sufficient crystallization cannot be performed. On the other hand, if the time is longer than the above-mentioned range, there is a possibility that the piezoelectric film layer or the substrate may be eroded. The treatment time is set, for example, at about 30 minutes.

Upper Electrode Forming Step (FIG. 5(f))

The upper electrode 42 is formed over the piezoelectric firm layer 41 by using technique of electron beam deposition, sputtering or the like. Platinum (Pt) or the like is used as a material for the upper electrode. The upper electrode is made with a thickness of about 100 nm.

The layered structure of the piezoelectric actuator is completed in the above-described step. It is only necessary to mold this layered structure by means of etching or the like in the shape that matches with a device to which the piezoelectric actuator is to be applied. In this embodiment, the treatment shown in the sectional views of manufacturing steps in FIGS. 6(a)–6(c) is further given because the piezoelectric actuator is used as a pressure generating source for an ink jet printing head.

Etching Step (FIG. 6(a))

The etching step is the step of forming the piezoelectric actuator 40. Firstly, the laminated structures 41 and 42 of the piezoelectric actuator are masked in the shape corresponding to the cavities to be formed in the pressure chamber substrate 20. Etching is then performed around the mask, thereby forming the piezoelectric actuators 40. Specifically speaking, a resist material is first applied with a uniform thickness by any method such as spinner method or a spray method. Subsequently, the mask is formed in the shape of the piezoelectric actuators, and exposure and development is then performed, thereby forming a resist pattern over the upper electrode 42. The mask is formed in accordance with the type, whether positive or negative, of the resist material. Then, ion milling, dry etching or other method which is normally employed is applied to etch and remove the upper electrode 42 and the piezoelectric film layer 41. In the manner described above, the piezoelectric actuators 40 appropriate for the ink jet printing head can be formed.

Pressure Chamber Forming Step (FIG. 6(b))

The pressure chamber forming step is the step of forming cavities 21 by etching the side of the pressure chamber substrate 20 as opposed to the side where the piezoelectric actuators 40 are formed. Etching of spaces for the cavities 21 is performed by employing anistropic etching which utilizes active gas, such as plane-parallel plate type reactive ion etching, from the side opposite to the side with the piezoelectric actuators 40 formed thereon. The portions which have remained without being etched become side walls 22.

Nozzle Plate Pasting Step (FIG. 6(c))

The nozzle plate pasting step is the step of pasting a nozzle plate 10 on the etched silicon substrate 20 with an adhesive. At the time of pasting, the nozzle plate is aligned so that respective nozzle holes 11 will be located at the positions corresponding to the respective spaces of the cavities 21. Lastly, the pressure chamber substrate 20 with the nozzle plate 10 pasted thereon is attached to a housing 25 (as shown in FIG. 2), thereby completing the ink jet printing head 1.

If the nozzle plate and the pressure chamber substrate are etched and formed integrally, the nozzle plate pasting step is unnecessary. Namely, it is only necessary to etch the pressure chamber substrate in the shape of a combination of the nozzle plate and the pressure chamber substrate and to make nozzle holes lastly at the positions corresponding to the cavities.

Next, the ink jet printing head with lead zirconate titanate ($Pb(Zr_{0.56}Ti_{0.44})O_3$) as the piezoelectric film layer is manufactured on the basis of the above-described manufacturing method.

A traced drawing of a sectional SEM (Scanning Electron Microscopy) photograph of this crystal after the hydrothermal treatment has been taken is shown in FIG. 7.

PZT crystal grains in a cumulonimbus shape are formed over the lower electrode. Each of these crystal grains are columnar crystal grains, which gather to compose cumulonimbus-shaped crystals. Concerning the respective columnar crystal grains, some of them are crystals perpendicular to the lower electrode, some of them have an angle distribution from 0 to 90° with respect to the normal direction of lower electrode surface. The grain diameter of the individual columnar crystal grains ranges from 100 nm to 400 nm. As a result of measurement of these crystals by an X-ray pole figure, it is confirmed that the crystals are random-oriented in the film thickness direction. No erosion of the silicon substrate is confirmed.

According to the first embodiment, since an alkaline solution of extremely low concentration is used as the treatment solution, the piezoelectric film or the substrate will never be etched by the treatment solution.

Moreover, since the alkali concentration is low, impurities such as alkali metal cations will not enter the inside of the piezoelectric actuators to deteriorate their characteristics.

Also, since crystallization can be performed at low temperatures, it is easy to give treatment for the crystallization.

Since high-temperature treatment is not performed, the elements of the lower electrode will never be dispersed in the piezoelectric film, thereby preventing the deterioration of the characteristics of the piezoelectric actuator.

Furthermore, since high-temperature treatment is not performed, neither changes in characteristics nor thermal stresses will be generated in the respective films, thereby enhancing the reliability of the piezoelectric actuator and the ink jet printing head.

Since the treatment solution is extremely low alkaline, it is unnecessary to select alkali-proof materials for the lower electrode or the substrate and, therefore, it is possible to expand the range of material selection.

Moreover, high-temperature treatment is not necessary and the rate of failure occurrence is low, thereby it is possible to reduce costs.

Furthermore, since no high-temperature treatment is performed and little thermal stress is generated, cracks will not be generated due to the thermal stress even if the piezoelectric actuator with a large area is manufactured. In other words, it is possible to provide an ink jet printing head suitable for a large area printing device such as a line printer.

This invention is not limited to the above-described embodiment, and various modifications can be made to adapt this invention. For example, PZT is used in the above embodiment, while piezoelectric ceramic for other actuators can be similarly crystallized by the hydrothermal method.

Moreover, the piezoelectric actuator manufactured according to this invention can be applied not only to a pressure generating source for the ink jet printing head, but also to actuator devices, including piezoelectric fans, ultrasonic motors, or ultrasonic transducers, and to the manufacture of such devices. Namely, the piezoelectric actuator of this invention can be made with a large area and realize cost reduction and, therefore, it is possible to provide new uses which may be too costly to be used in conventional products. Further, the piezoelectric actuator of the present invention can provide conventional functions at lower prices.

Embodiment 2

A printer of the second embodiment of the present invention is hereinafter explained with reference to FIG. 8.

Concerning the second embodiment, the same reference numerals are given to the members similar to those of the first embodiment, and any detailed explanations thereof are omitted.

The printer of the second embodiment is capable of functioning as a line printer and, as shown in FIG. 8, its main body 2 has a tray 3, an outlet 4, and an operation button 9 provided thereon. Inside of the main body 2, an ink jet printing head 50, a feeding mechanism 6, and a control circuit 8 are provided.

The ink jet printing head 50 comprises a piezoelectric actuator manufactured by the manufacturing method of this invention. This head 50 is a head specifically used for a line printer and is formed with the length that covers the width of paper which can be fed. In other words, this head 50 is formed by the manufacturing method of this invention, in such size (length) as has been impossible by the prior art. The ink jet printing head 50 is composed to be capable of discharging ink from nozzles, which are made in the full width of paper, in response to a discharge signal Sh supplied from the control circuit 8.

The ink jet printing head 50 is constructed in a manner such that piezoelectric actuators 40, cavities 21 and nozzles 11 are continuously provided at a constant pitch so that the head 50 can cover the width of paper which is to be printed. The pitch between the nozzles can be changed at any time in accordance with printing accuracy. For example, the nozzles are located to realize 400 dpi.

The printer of the second embodiment has the structure similar to that of the printer described in the first embodiment, except that the head 50 is a head designed for a line printer, and the actions of the printer also conform with those of the printer of the first Embodiment.

Any characters or graphics can be printed by supplying the discharge signal Sh to the individual piezoelectric actuator located at a position in the long head where printing is required.

An explanation is hereinafter given about a method for manufacturing a piezoelectric actuator together with a method for manufacturing an ink jet printing head.

In the second embodiment, a silicon substrate formed in an elongated shape is used in order to manufacture the head 50 for a line printer.

First, the same method as in the first embodiment is applied to manufacture a sol, an insulating film, a lower electrode, and a piezoelectric precursor film layer.

In a hydrothermal treatment step, if an alkaline solution is used as the treatment solution, any one of the following can be used as a solution: KOH, $Ba(OH)_2$, $Pb(OH)_2$, a mixed solution of $Ba(OH)_2$ and $Pb(OH)_2$, a mixed solution of KOH and $Ba(OH)_2$ and a mixed solution of KOH and $Pb(OH)_2$. This is because it is confirmed that piezoelectric ceramic crystallizes in these alkaline solutions.

The concentration of the alkaline solution is adjusted to be lower than 2 M[mol/l]. If the concentration is 2 M[mol/l] or higher, the alkali is strong and, therefore, there is a possibility that the piezoelectric film and the substrate may be eroded. In the second embodiment, the concentration is adjusted to be 0.5 M[mol/l].

The temperature for the hydrothermal treatment is set in the range of 100° C. to 200° C. If the temperature is lower than the above-mentioned range, the crystallization will not be promoted. On the other hand, if the temperature is higher than the above-mentioned range, the piezoelectric film layer and the silicon substrate will be etched. The treatment temperature is set, for example, at about 140° C.

The pressure for the hydrothermal treatment is set in the range of 2 atmospheric pressure to 10 atmospheric pressure. This is because good crystals cannot be obtained if the pressure is out of the above-mentioned range. The pressure is set, for example, at about 4 atmospheric pressure. The time for the hydrothermal treatment is set from 10 minutes to 60 minutes. If the time is shorter than the above-mentioned range, sufficient crystallization cannot be performed. On the other hand, if the time is longer than the above-mentioned range, there is a possibility that the piezoelectric film layer or the substrate may be eroded. The treatment time is set, for example, at about 30 minutes.

Subsequently, in the same manner as in the first embodiment, the upper electrode forming step, the etching step, the pressure chamber forming step, and the nozzle plate pasting step are performed, thereby completing the ink jet printing head 50.

As an example of the above-described manufacturing method, a piezoelectric actuator with lead zirconate titanate $(Pb(Zr_{0.56}Ti_{0.44})O_3)$ as the piezoelectric film layer is manufactured.

A piezoelectric film manufactured by a conventional complete sol-gel method is used as Comparative Example 1, and a piezoelectric film manufactured by a conventional hydrothermal method is used as Comparative Example 2. The piezoelectric film of Comparative Example 1 is manufactured by giving high-speed thermal treatment (at 650° C. for five minutes and at 900° C. for one minute) to a PZT precursor film in an amorphous state in an oxygen atmosphere.

The piezoelectric film of Comparative Example 2 is manufactured by dipping a Ti or Ni substrate in a KOH solution containing $Pb^{+2}$, $Zr^{+4}$ and $Ti^{+4}$ and by causing PZT grains to deposit.

FIG. 9 shows a sectional transmission electron diffraction spot photograph of the piezoelectric film layer of the second embodiment, to which hydrothermal treatment has been given according to this invention. As can be seen in this photograph, the diffraction spots are arranged regularly and the crystallization is performed well.

According to a cross-sectional TEM (Transmission Electron Microscopy) dark field photograph, as shown in FIGS. 10(a) and 10(b), and a plan SEM (Scanning Electron Microscopy) photograph, as shown in FIGS. 11(a) and 11(b), of the piezoelectric film layer, it is confirmed that the mean diameter of the columnar crystal grains is approximately in the range of 100 nm to 15,000 nm.

FIG. 12 shows a reflection X-ray diffraction (XRD) spectrum of this piezoelectric film layer. As can be seen in FIG. 12, the piezoelectric PZT film has (110) preferred orientations in direction parallel to the normal direction of lower electrode surface. According to the X-ray pole figure and the sectional transmission electron diffraction pattern, the PZT film has (110) preferred orientations in direction parallel to the normal direction of lower electrode surface.

In comparison with Comparative Example 1, the piezoelectric actuator of this embodiment can be made with a large area because there is little internal stress caused by heat. In Comparative Example 1, the internal stress generated in the film due to the crystallization is about $10^8$ Pa, while the internal stress generated in the case of the piezoelectric actuator of this embodiment is about $10^6$ to $10^7$ Pa. Moreover, since Comparative Example 1 adopts high-temperature thermal treatment, thermal expansion of the electrodes or the piezoelectric film occurs or their components diffuse. However, since in the second embodiment the crystallization is promoted by lowering temperatures, no deformation occurs due to thermal expansion and the performance of the piezoelectric actuator will not deteriorate due to the diffusion of the components. Accordingly, the second embodiment is expected to enhance yields and to reduce manufacturing costs.

In comparison with Comparative Example 2, only the PZT crystallization is promoted by the manufacturing method of this invention, which is adopted in the second embodiment, the composition control of the piezoelectric film is not so difficult as is in Comparative Example 2. Moreover, with the piezoelectric actuator of Comparative Example 2, the surface roughness of its upper electrode side is 1 μm or more as a maximum height, while it is greatly improved as 0.01 μm or less with the piezoelectric actuator of the second embodiment. Furthermore, because the alkaline solution of comparatively weak degree or of low concentration is used for the manufacture, this embodiment is characterized in that the range of material selection for the electrodes and the substrate is wider than that of Comparative Example 2.

Since in the second embodiment the alkali concentration is low, impurities such as alkali metal cations will not enter the inside of the piezoelectric actuators to deteriorate their characteristics.

Also, crystallization can be performed at low temperatures, thereby it is easy to give treatment for the crystallization.

Moreover, since high-temperature treatment is not performed, the elements of the lower electrode will never diffuse in the piezoelectric film, thereby preventing the deterioration of the characteristics of the piezoelectric actuator.

Furthermore, since high-temperature treatment is not performed, neither changes in characteristics nor thermal stresses will be generated in the respective films, thereby enhancing the reliability of the piezoelectric actuators and the ink jet printing head.

Since the treatment solution of weak alkali or low concentration is used, it is unnecessary to select alkali-proof materials for the lower electrode or the substrate and, therefore, it is possible to expand the range of material selection.

Moreover, high-temperature treatment is not necessary and the rate of failure occurrence is low, thereby it is possible to reduce costs.

Furthermore, since no high-temperature treatment is performed and little internal stress, including thermal stress, is generated, cracks will not be generated even if a piezoelectric actuator with a large area is manufactured. In other words, it is possible to provide an ink jet printing head suitable for a large area printing device such as a line printer.

As described above, this invention makes it possible to provide a piezoelectric actuator which can be made with a large area and which has a crystal structure with flat surfaces.

It is also possible to provide an ink jet printing head which is suitable for a line printer and which comprises a piezoelectric actuator that can be made with a large area and with a flat surface.

Moreover, it is possible to provide a printer with an ink jet printing head suitable for a line printer.

Furthermore, the present invention provides a method for manufacturing a piezoelectric actuator by which the versatility of possible materials and options for manufacture conditions is high, and which has good performance.

The present invention also provides a method for manufacturing an ink jet printing head with a piezoelectric actuator by which the versatility of possible materials and options for manufacture conditions is high, and which has good performance.

What is claimed is:

1. A piezoelectric actuator comprising:
a lower electrode;
an upper electrode; and
a piezoelectric film disposed between said lower electrode and said upper electrode,
wherein said piezoelectric film is made of piezoelectric ceramic, and
wherein columnar crystal grains of the piezoelectric ceramic are random-oriented in a film thickness direction and a mean diameter of the columnar crystal grains is in the range of 100 nm to 15,000 nm.

2. A piezoelectric actuator according to claim 1, wherein a mean diameter of the columnar crystal grains is in the range of 100 nm to 10,000 nm.

3. A piezoelectric actuator according to claim 1, wherein the surface roughness of the upper electrode side of said piezoelectric film is 20 nm or less as a maximum height.

4. A piezoelectric actuator according to claim 1, wherein the element composition of said piezoelectric film comprises any one of the following piezoelectric ceramic materials: lead zirconate titanate ($Pb(Zr,Ti)O_3$:PZT), lead lanthanum titanate (($Pb,La)TiO_3$), lead lanthanum zirconate (($Pb,La)ZrO_3$), lead lanthanum zirconate titanate (($Pb,La)(Zr,Ti)O_3$:PLZT), and lead magnesium niobate zirconate titanate ($Pb(Mg,Nb)(Zr,Ti)O_3$:PNM-PZT).

5. An ink jet printing head with a piezoelectric actuator according to claim 1, comprising:
a pressure chamber substrate with a pressure chamber formed therein;
a diaphragm provided on one side of the pressure chamber; and
the piezoelectric actuator provided on said diaphragm at the position corresponding to the pressure chamber, said piezoelectric actuator being configured to cause volume changes of the pressure chamber.

6. A printer with an ink jet printing head according to claim 5, comprising:
a recording medium carrying mechanism configured to supply and discharge the recording media; and
a head control circuit which causes the ink jet printing head to print at any position on the recording medium supplied by said recording medium carrying mechanism.

7. A printer with an ink jet printing head according to claim 5, comprising:
a recording medium carrying mechanism configured to supply and discharge the recording media; and
a head carrying mechanism which carries the ink jet printing head to any position on the recording medium supplied by said recording medium carrying mechanism.

8. A method for manufacturing a piezoelectric actuator comprising a piezoelectric film disposed between a lower electrode and an upper electrode, comprising the steps of:
forming a precursor film in an amorphous state, containing metal and oxygen, over the lower electrode; and
providing hydrothermal treatment to the precursor film by dipping the precursor film in a given alkaline aqueous solution to promote crystallization of the precursor film under certain conditions.

9. A method for manufacturing a piezoelectric actuator according to claim 8, wherein the alkaline aqueous solution is adjusted to obtain the concentration not higher than 2 M[mol/l] of an alkaline solute.

10. A method for manufacturing a piezoelectric actuator according to claim 8, wherein the alkaline aqueous solution is adjusted to obtain the concentration not higher than 0.5 M[mol/l] of an alkaline solute.

11. A method for manufacturing a piezoelectric actuator according to claim 8, wherein the alkaline aqueous solution is adjusted to obtain the concentration not higher than 0.1 M[mol/l] of an alkaline solute.

12. A method for manufacturing a piezoelectric actuator according to claim 8, wherein the alkaline aqueous solution is adjusted to obtain the concentration not higher than 0.05 M[mol/l] of an alkaline solute.

13. A method for manufacturing a piezoelectric actuator according to claim 8, wherein said step of forming the precursor film comprises the steps of:
applying a sol containing organometallic compound over the lower electrode; and
heating the compound.

14. A method for manufacturing a piezoelectric actuator according to claim 13, wherein the step of forming the precursor is composed by repeating, at least once, the steps of:
applying the organometallic compound solution;
drying a film of organometallic compound, which is formed by the application, at a first temperature; and
pyrolysing the dried organometallic compound film at a second temperature.

15. A method for manufacturing a piezoelectric actuator according to claim 8, wherein the step of forming the precursor film comprises the steps of:
applying a precursor composed of organometallic compound over the lower electrode;
drying the precursor at a given temperature; and
pyrolysing the precursor at temperatures ranging from 300° C. to 500° C.

16. A method for manufacturing a piezoelectric actuator according to claim 15, wherein said pyrolysing step, comprises degreasing the precursor at a temperature of 450° C.

17. A method for manufacturing a piezoelectric actuator according to claim 15, wherein said drying step comprises drying the precursor at temperatures ranging from 150° C. to 200° C.

18. A method for manufacturing a piezoelectric actuator according to claim 15, wherein said steps of applying the precursor, drying the precursor, and pyrolysing the dried precursor are repeated at least once.

19. A method for manufacturing a piezoelectric actuator according to claim 8, wherein the alkaline solution comprises any one of the following: KOH, $Ba(OH)_2$, $Pb(OH)_2$, $Ba(OH)_2+Pb(OH)_2$, $KOH+Ba(OH)_2$, and $KOH+Pb(OH)_2$.

20. A method for manufacturing a piezoelectric actuator according to claim 8, wherein said step of forming the precursor, comprises any one of the following methods: an RF sputtering method, an ion beam sputtering method, and an electron beam deposition method.

21. A method for manufacturing a piezoelectric actuator according to claim 8, wherein the certain conditions in the hydrothermal treatment step comprise promoting crystallization at temperatures ranging from 100° C. to 200° C. and at pressure of 10 or lower atmospheric pressure.

22. A method for manufacturing a piezoelectric actuator according to claim 8, wherein the certain conditions in the hydrothermal treatment step comprise promoting crystallization at a temperature of 140° C. and at 4 atmospheric pressure.

23. A method for manufacturing an ink jet printing head comprising a piezoelectric actuator manufactured by the manufacturing method of claim 8, wherein said method for manufacturing an ink jet printing head comprises the steps of:

forming a diaphragm on one side of a substrate;

manufacturing the piezoelectric actuator on the diaphragm; and forming a pressure chamber by etching the substrate in such arrangement that the diaphragm with the piezoelectric actuator provided thereon forms one side of the pressure chamber.

\* \* \* \* \*